(12) United States Patent
Yamada et al.

(10) Patent No.: US 7,643,296 B2
(45) Date of Patent: Jan. 5, 2010

(54) MOTOR DRIVE CIRCUIT AND OUTDOOR UNIT FOR AIR CONDITIONER

(75) Inventors: Michio Yamada, Tokyo (JP); Hitosi Kawaguchi, Tokyo (JP); Kazunori Sakanobe, Tokyo (JP); Yosuke Shinomoto, Tokyo (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 56 days.

(21) Appl. No.: 11/920,353

(22) PCT Filed: Dec. 18, 2006

(86) PCT No.: PCT/JP2006/325177

§ 371 (c)(1),
(2), (4) Date: Nov. 14, 2007

(87) PCT Pub. No.: WO2007/080748

PCT Pub. Date: Jul. 19, 2007

(65) Prior Publication Data

US 2008/0266811 A1    Oct. 30, 2008

(30) Foreign Application Priority Data

Jan. 16, 2006    (JP) .............................. 2006-006849

(51) Int. Cl.
*H05K 7/20*    (2006.01)

(52) U.S. Cl. ........................ 361/704; 361/719; 361/720; 361/721; 174/52.1; 165/80.3

(58) Field of Classification Search ........................ None
See application file for complete search history.

(56) References Cited

U.S. PATENT DOCUMENTS 5,203,178 A    4/1993    Shyu (Continued)

FOREIGN PATENT DOCUMENTS

EP    1009030 A2    6/2000

(Continued)

OTHER PUBLICATIONS

International Search Report for PCT/JP2006/325177 dated Mar. 13, 2007.

(Continued)

*Primary Examiner*—Boris L Chervinsky
(74) *Attorney, Agent, or Firm*—Buchanan Ingersoll & Rooney PC

(57) ABSTRACT

One of the purpose is to obtain a motor drive circuit and an outdoor unit for an air conditioner using the same, which can flexibly support change of a model at a low price and in a small lot without using unnecessary materials, wherein a stress in a soldering part due to self-heating is low, a solder reliability is high, and design constraints are small, while maintaining a low-noise and low-loss power wiring due to lowering inductance. The motor drive circuit according to the present invention, for driving the motor using the converter circuit and the inverter circuit, whereon electronic components making up a converter circuit and an inverter circuit are mounted, which includes a lead frame molded board 100 wherein metal plate leads 37 are molded with a mold resin 36, and a single-sided printed circuit board 31 for a control circuit, and wherein power terminals 30 of the electronic components are connected to the lead frame molded board 100, and control wiring terminals 39 of the electronic components are connected to the single-sided printed circuit board 31.

30 Claims, 17 Drawing Sheets

U.S. PATENT DOCUMENTS

| | | | |
|---|---|---|---|
| 5,373,418 A * | 12/1994 | Hayasi | 361/707 |
| 5,831,240 A | 11/1998 | Katooka et al. | |
| 5,914,577 A | 6/1999 | Furnival | |
| 6,094,928 A | 8/2000 | Oyabu et al. | |
| 6,281,579 B1 | 8/2001 | Siu | |
| 6,327,165 B1 * | 12/2001 | Yamane et al. | 363/132 |
| 6,600,653 B2 * | 7/2003 | Koike et al. | 361/704 |
| 6,650,559 B1 * | 11/2003 | Okamoto et al. | 363/141 |
| 6,704,202 B1 * | 3/2004 | Hamaoka et al. | 361/704 |
| 6,724,627 B2 * | 4/2004 | Onizuka et al. | 361/704 |
| 6,838,839 B2 * | 1/2005 | Goto et al. | 318/139 |
| 6,875,029 B2 * | 4/2005 | Kawabata et al. | 439/76.2 |
| 6,972,959 B2 * | 12/2005 | Asai et al. | 361/719 |
| 6,989,658 B2 | 1/2006 | Allwang et al. | |
| 7,110,246 B2 * | 9/2006 | Tsunooka et al. | 361/637 |
| 7,206,204 B2 * | 4/2007 | Nakatsu et al. | 361/703 |
| 2005/0151229 A1 | 7/2005 | Imaizumi et al. | |
| 2005/0204760 A1 | 9/2005 | Kurita et al. | |

FOREIGN PATENT DOCUMENTS

| | | |
|---|---|---|
| JP | 06-123449 A | 5/1994 |
| JP | 06-125151 A | 5/1994 |
| JP | 08-236970 A | 9/1996 |
| JP | 09-083131 A | 3/1997 |
| JP | 10-093220 A | 4/1998 |
| JP | 63-110960 A | 5/1998 |
| JP | 10-303522 A | 11/1998 |
| JP | 11-204907 A | 7/1999 |
| JP | 2002-111250 A | 4/2002 |
| JP | 2002-233165 A | 8/2002 |
| JP | 2003-101258 A | 4/2003 |
| JP | 2003096699 | 4/2003 |
| JP | 2003-264354 A | 9/2003 |
| JP | 2004-526395 A | 8/2004 |
| JP | 2005-133996 A | 5/2005 |
| JP | 2005-168149 A | 6/2005 |

OTHER PUBLICATIONS

Supplementary European Search Report dated May 11, 2009, 14 pages.

* cited by examiner

MOTOR DRIVE CIRCUIT AND OUTDOOR UNIT FOR AIR CONDITIONER

FIELD

The present invention relates to a motor drive circuit using a converter and an inverter, and an outdoor unit for an air conditioner using the motor drive circuit.

BACKGROUND

A conventional inverter circuit having a semiconductor switching element and a smoothing capacitor is equipped with a substrate whereon a conductor pattern is formed and the semiconductor switching element is mounted, a case carrying the substrate and forming a shell, a molded substrate carrying the smoothing capacitor, whereon a wiring pattern made of a conductive metal is formed by insert molding with a mold resin, and wherein the smoothing capacitor is connected to the wiring pattern, and a molded substrate terminal having a tap placed on the case. It is suggested a power module wherein an inverter circuit is configured by fixing the molded substrate to the case by securing the molded substrate to the tap of the molded substrate terminal with a screw to provide electrical connection therebetween (For example, refer to Patent literature 1).

Further, it is suggested an inverter circuit configured by mounting and wiring an electrolytic capacitor for power smoothing on a power wiring board, which is more expensive than a printed circuit board, and by fastening power elements with a screw (For example, refer to Patent literature 2).

Patent literature 1: Japanese Patent No. 3649133

Patent literature 2: Unexamined Patent Publication No. 63-110960

In the conventional circuit described in Patent literature 1, a shell case for carrying a board whereon a switching element is mounted is required. It is necessary to form electrodes and to perform insert molding to form electrodes on this shell case. Therefore, there is a problem that materials and additionally a die, a molding machine, processing for forming electrodes and performing insert molding are necessary. Further, there is another problem that when a circuit configuration is changed, wherein change of the die is required, and it is impossible to handle a model change in a small lot.

As for a substrate, a metal substrate is used which is a metal whereon an insulator is shaped, over which a copper foil is applied, having both a radiation function and a power wiring function. This is a method of mounting a radiation surface of semiconductor components on a substrate side, wherein the cost per unit area of a base material of the substrate itself is 10 to 20 times as expensive as that of a printed circuit board. Therefore, even if the area of the substrate can be reduced, this does not lead to a cost reduction commensurate with that in a case of using a printed circuit board.

The substrate is significantly expensive in the cost per square meter in comparison with a substrate whose function is restricted to a wiring function, and is not economical. Additionally, to mount a semiconductor on the substrate, there is a need to perform wiring of a gate terminal of a switching element, which is originally operative with a low voltage and a low electrical current and which does not need radiation, on an expensive metal substrate, to makes it more uneconomical. Further, since wiring of a copper foil is performed by etching, thickness of a copper foil results in a long etching time as in the printed circuit board. Furthermore, radiation of a radiation component, such as a power IC, is performed by dissipating the heat of a radiation surface of the radiation component through a copper foil and an insulator, and further through a metal plate toward a radiating fin. Such a configuration is wasteful and uneconomical rather than in fixing the radiating fin directly to a component.

Further, since a smoothing capacitor large in size is mounted on an insert-molded substrate which requires a die and a molding machine, it is necessary to cover the cost of the die and the molding machine by mass production for cost reduction. To increase the number of the insert-molded substrate to mount the smoothing capacitor, there is a need to use the same shape of substrates for products with a plural range of capacities. In this case, it is necessary to standardize the smoothing capacitors with that of a largest capacity model. Therefore, by contrast, unnecessary materials are used for small capacity models large in amount. Since the smoothing capacitor is one of the largest components in the inverter circuit along with the reactor, the unnecessary materials are significant compared to in a case of mounting on a printed circuit board.

Further, since the case forming a shell carrying the substrate whereon the switching element is mounted has a structure wherein the electrodes have a planar contact with the substrate, and the electrodes and the substrate are joined with soldering, the solder strength against heat shrink is small.

Further, a conventional circuit lacks area efficiency since a power device is directly mounted on a printed circuit board, and a high voltage and a high electrical current wiring, which requires a pattern width and a pattern-to-pattern spacing, is formed on the printed circuit board as a planar wiring. Therefore, the electrical component case itself is large in size.

Furthermore, there is a large wiring inductance and a large developmental noise. Moreover, temperature rise at a foot part of the power module is large so that there is a design constraint on solder life.

Further, since etching is used for forming a copper foil wiring on the printed circuit board or the metal substrate, it takes time for etching when forming a wiring for a power wiring with a thick copper foil, which increases unit cost of the board. When the wiring is formed on the same board, a thick copper foil is used even for a fine wiring such as a control wiring, and unnecessary materials are used.

Furthermore, in the conventional inverter circuit described in Patent literature 2, since the inverter circuit is configured by fixing power elements with screws, extra screws are needed and the cost is increased. Since it takes more time and cost to process screw tightening, it does not suit for mass production of a circuit, such as an inverter for an air conditioner to be produced in large quantities. Meanwhile, it may be also considered a method to fix a connector or a metal terminal, etc. by soldering to join the connector or the metal terminal, etc. with a printed circuit board. However, another connector or wire lead becomes necessary, and extra time for forming lead joints is needed. Further, since screw tightening and connector connecting are of human works, there is a high provability that defective joints are generated. If defective joints are generated, there is a high risk of temperature rise, a smoking and an ignition due to a bad connection at a power unit. To avoid these, it is necessary to take time for inspection process.

Further, in the conventional inverter circuit described in Patent literature 2, the electrolytic capacitor for power smoothing is mounted and wired on a power wiring board, which is more expensive than a printed circuit board. However, it is not economical to mount on a power wiring board an electrolytic capacitor, whose wiring is originally simple for the large area of the component. Further, the capacitance of the electrolytic capacitor varies greatly depending on the models. When a substrate is standardized according to one with the largest capacitance value, a model having a large volume of sales and using an electrolytic capacitance with a low capacitance value produces much waste.

The present invention is made to solve the problems as shown above, and one of the purposes is, while maintaining a low-noise and low-loss power wiring due to lowering inductance, to obtain a motor drive circuit and an outdoor unit for an air conditioner using the same, which can flexibly support change of a model at a low price and in a small lot without using unnecessary materials, wherein a stress in a soldering part due to self-heating is low, a solder reliability is high, and design constraints are small.

SUMMARY OF THE INVENTION

There is provided according to one aspect of the present invention, a motor drive circuit for driving the motor using a converter circuit and an inverter circuit, the motor drive circuit including:

a lead frame molded board whereon an electronic component making up the converter circuit and the inverter circuit is mounted, and whereon a metal plate lead is molded with a mold resin; and a printed circuit board for a control circuit, wherein a power terminal of the electronic component is connected to the lead frame molded board, and a control wiring terminal of the electronic component is connected to the printed circuit board.

The converter circuit includes an electrolytic capacitor, the electrolytic capacitor being mounted on the printed circuit board.

The inverter circuit includes a shunt resistance for detecting a current, the shunt resistance being mounted on the lead frame molded board.

The lead frame molded board includes a projection as a spacer formed together with the mold resin.

The electronic component includes a radiating fin for cooling, and the projection, which is formed in a longer direction of a component surface of the lead frame molded board whereon the electronic component is mounted, adjusts a height of the electronic component whereto the radiating fin is fixed.

The projection is formed between the printed circuit board and the lead frame molded board in a shorter direction of the lead frame molded board as a spacer.

Another projection is additionally provided over the projection, the another projection being engaged with a hole formed in the printed circuit board.

The lead frame molded board includes the metal plate lead, by which the lead frame molded board is connected with the printed circuit board.

The metal plate lead is bent to connect the lead frame molded board with the printed circuit board.

A connection of the power terminal with the lead frame molded board and a connection of the control wiring terminal with the printed circuit board are made by soldering.

The printed circuit board is made up of a single-sided printed circuit board.

The single-sided printing circuit board is made up of a paper base material.

The printing circuit board is made up of a double-sided printed circuit board. Further, there is provided according to another aspect of the present invention, an outdoor unit for an air conditioner including a compressor for compressing a refrigerant in a machine chamber, wherein an electrical component case carrying the motor drive circuit is fixed to an upper surface of the compressor.

The motor drive circuit includes an acceleration sensor.

The electronic component includes a diode bridge, the diode bridge being arranged at an end of a long axis of the lead frame molded board.

The motor drive circuit including an alternating-current power wiring on an opposite side of an alternating-current reactor, the alternating-current power wiring being connected to an alternating-current source, wherein the alternating-current power wiring on the opposite side of the alternating-current reactor is formed adjacent to the end of the long axis of the lead frame molded board whereon the diode bridge is arranged, and near an end of the printed circuit board.

The lead frame molded board is mounted at an right angle with the printed circuit board.

A power device of the electronic component is mounted at an right angle with the printed circuit board.

The power device includes a power module, of which a control wiring terminal and a power terminal are linearly arranged.

Further, there is provided according to another aspect of the present invention, a motor drive circuit for driving the motor using a converter circuit and an inverter circuit, the motor drive circuit including:

a multi-layer printed circuit board whereon an electronic component making up the converter circuit and the inverter circuit is mounted; and a printed circuit board for a control circuit, wherein a power terminal of the electronic component is connected to the multi-layer printed circuit board, and a control wiring terminal of the electronic component is connected to the printed circuit board for the control circuit.

A connector for connecting with the motor is formed on the lead frame molded board at a same time as producing the lead frame molded board.

The lead frame molded board is less than or equal to a half size of the printed circuit board.

A current flowing in the shunt resistance is sampled to drive the motor.

The converter circuit includes an electrolytic capacitor, the electrolytic capacitor being mounted adjacent to the lead frame molded board or the multi-layer printed circuit board whereon the electronic component making up the converter circuit and the inverter circuit is mounted.

Further, there is provided according to another aspect of the present invention, an outdoor unit for an air conditioner, which is equipped with the motor drive circuit.

EFFECT OF THE INVENTION

It is possible for the motor drive circuit according to the present invention to significantly miniaturize a printed circuit board by the aforementioned configuration. Further, it is possible to lower noise by lowering inductance in a power wiring. Furthermore, it is possible to improve reliability of circuits and devices against a solder crack, etc.

DETAILED DESCRIPTION

Embodiment 1

Figure 1:
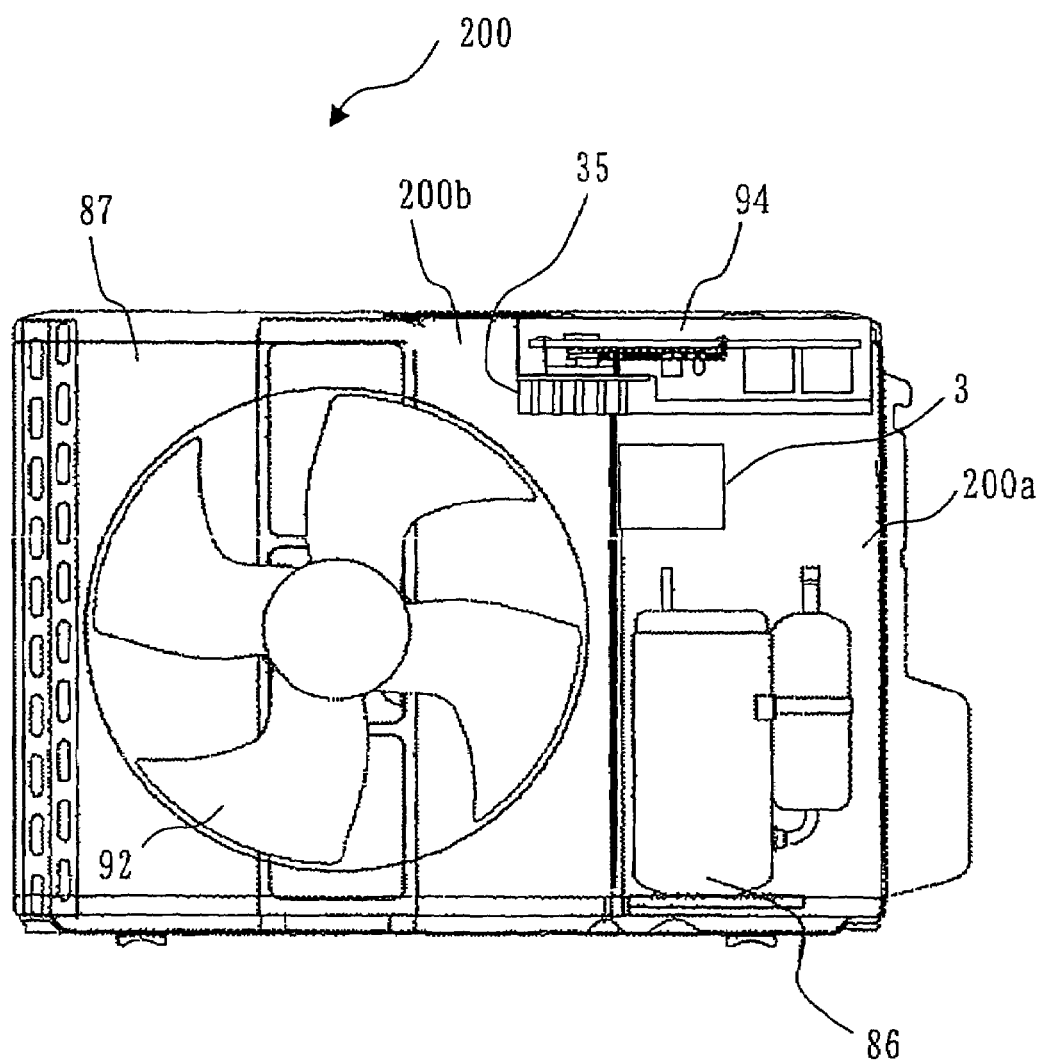
FIG. 1 A diagram describing the first embodiment, and is a perspective diagram of the outdoor unit 200 for the air conditioner.
Figure 2:
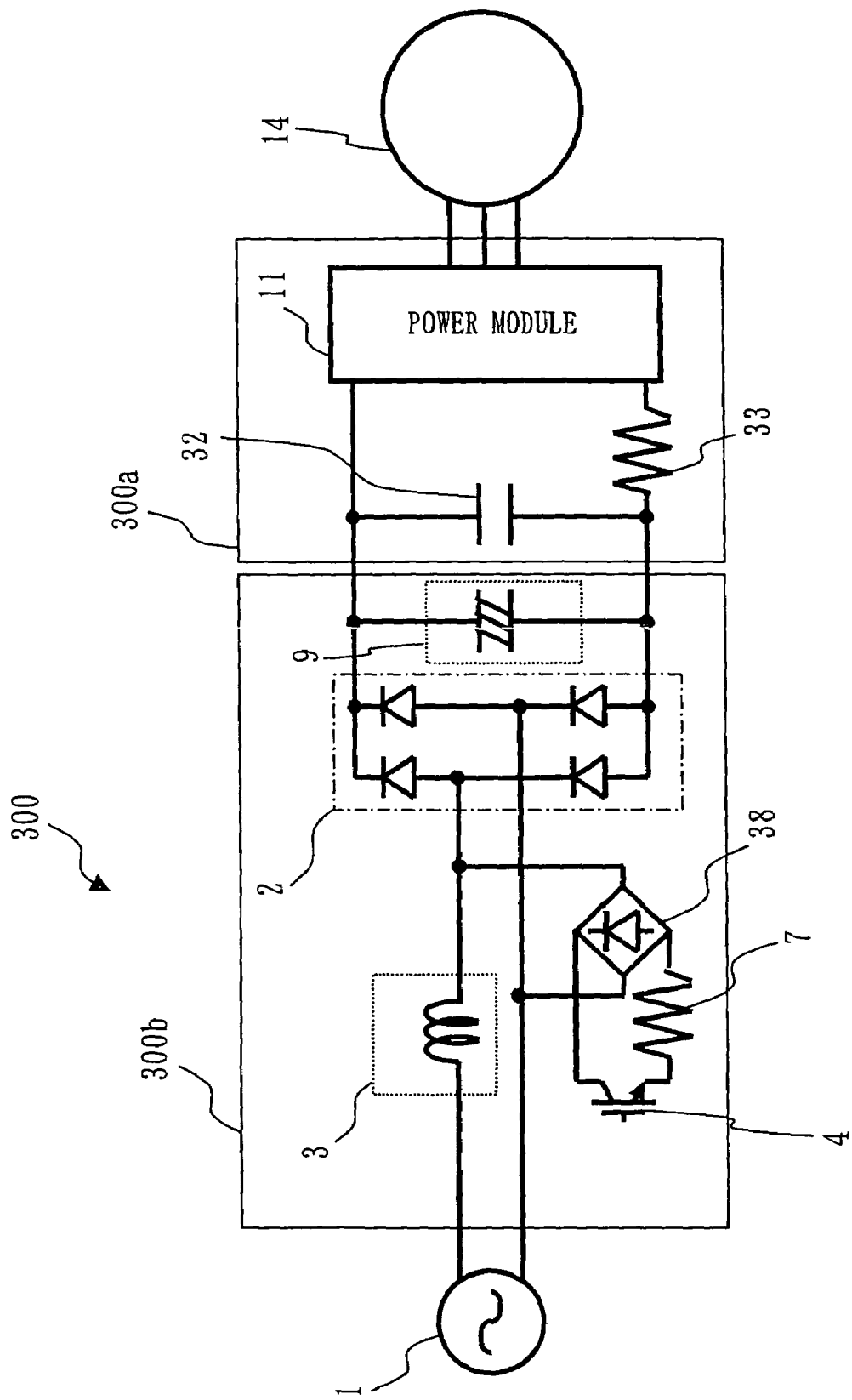
FIG. 2 A diagram describing the first embodiment, and is an electric circuit diagram of the inverter circuit for driving the compressor.
Figure 3:
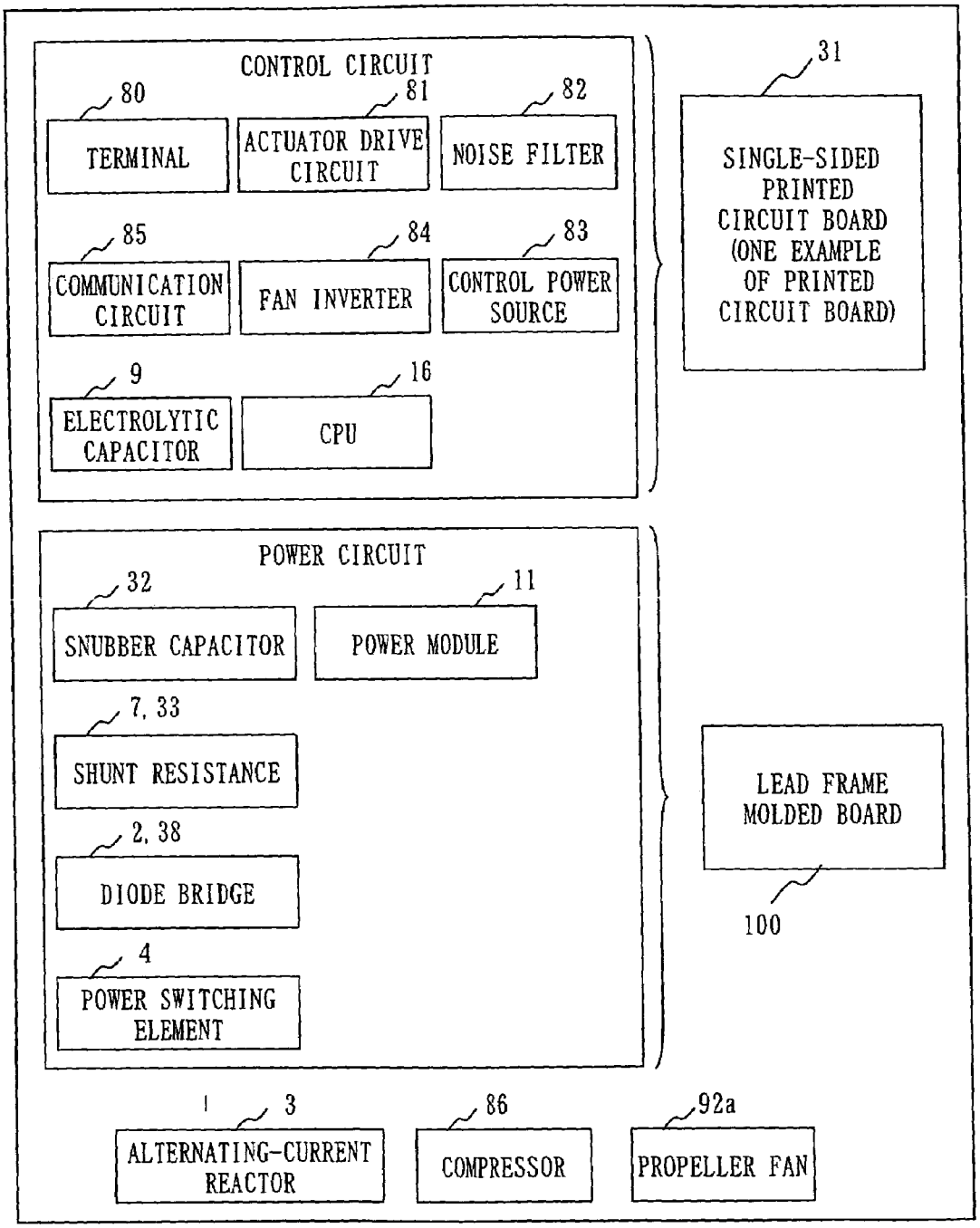
FIG. 3 A diagram describing the first embodiment, and is a configuration diagram of the electric components of the outdoor unit 200 for the air conditioner.
Figure 4:
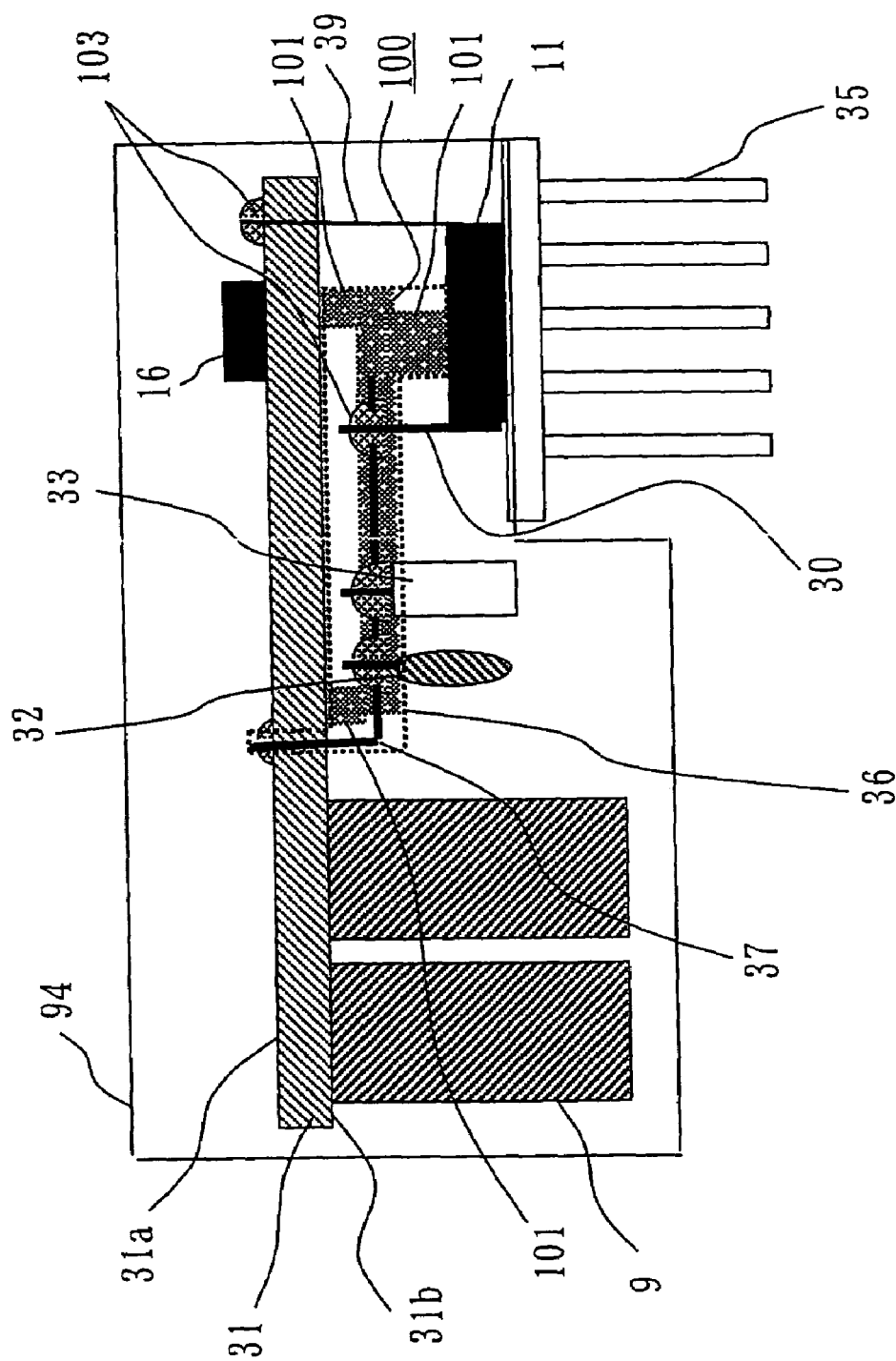
FIG. 4 A diagram describing the first embodiment, and is a perspective diagram of the electrical component case 94.
Figure 5:
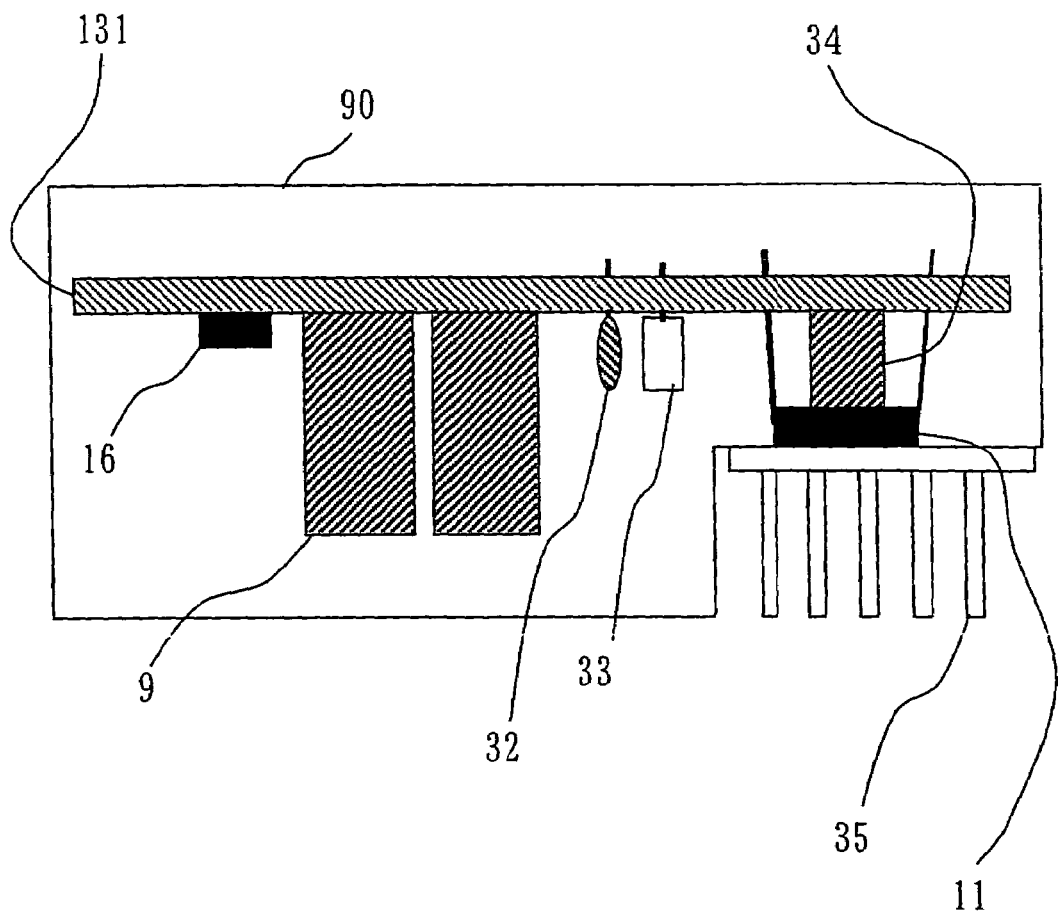
FIG. 5 A perspective diagram of the conventional electrical component case 90, shown for comparison.
Figure 6:
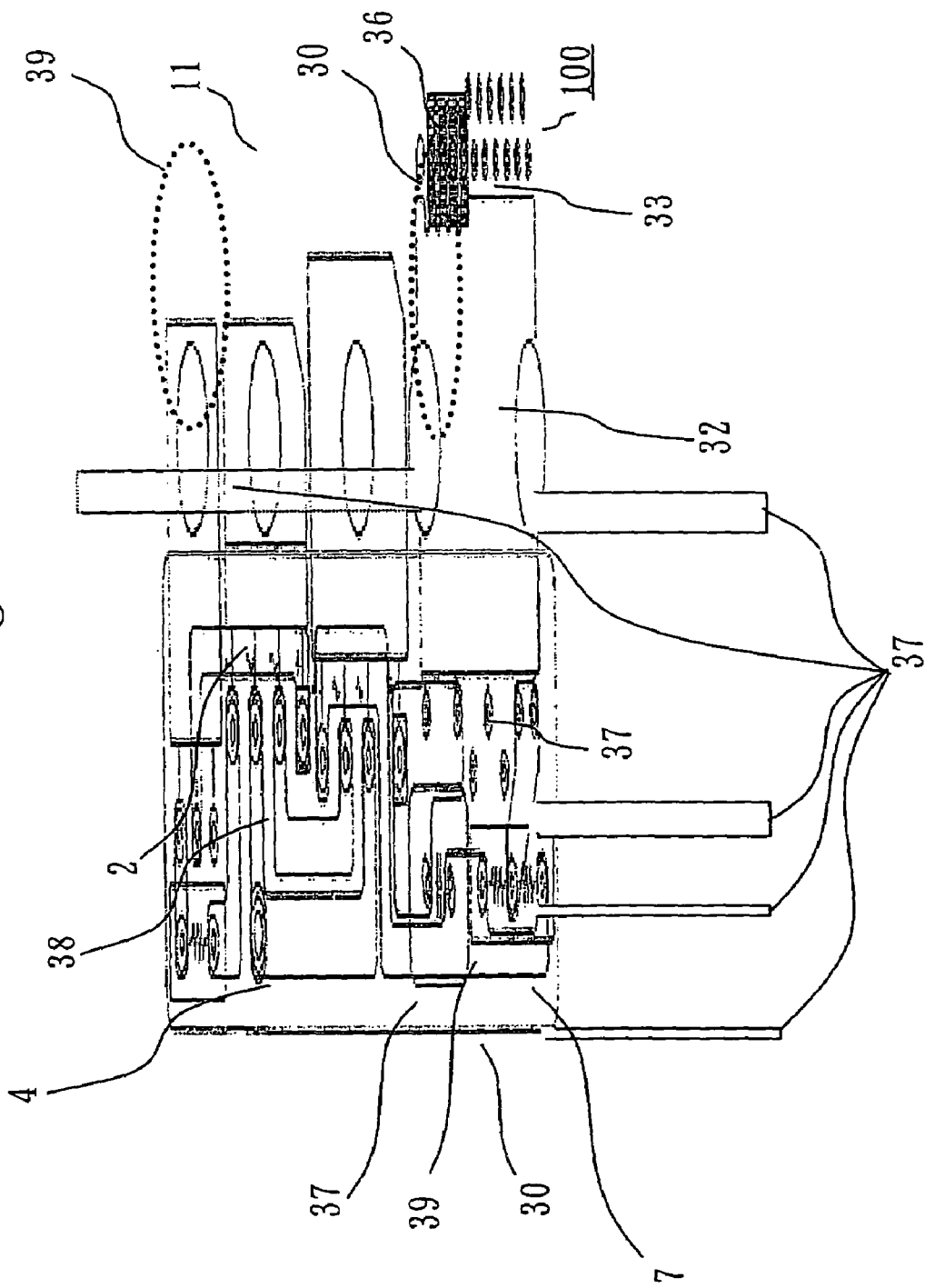
FIG. 6 A diagram describing the first embodiment, and is a plan view of the arrangement of the lead frame molded board 100 before bending the metal plate leads 37, and the mounting components.
Figure 7:
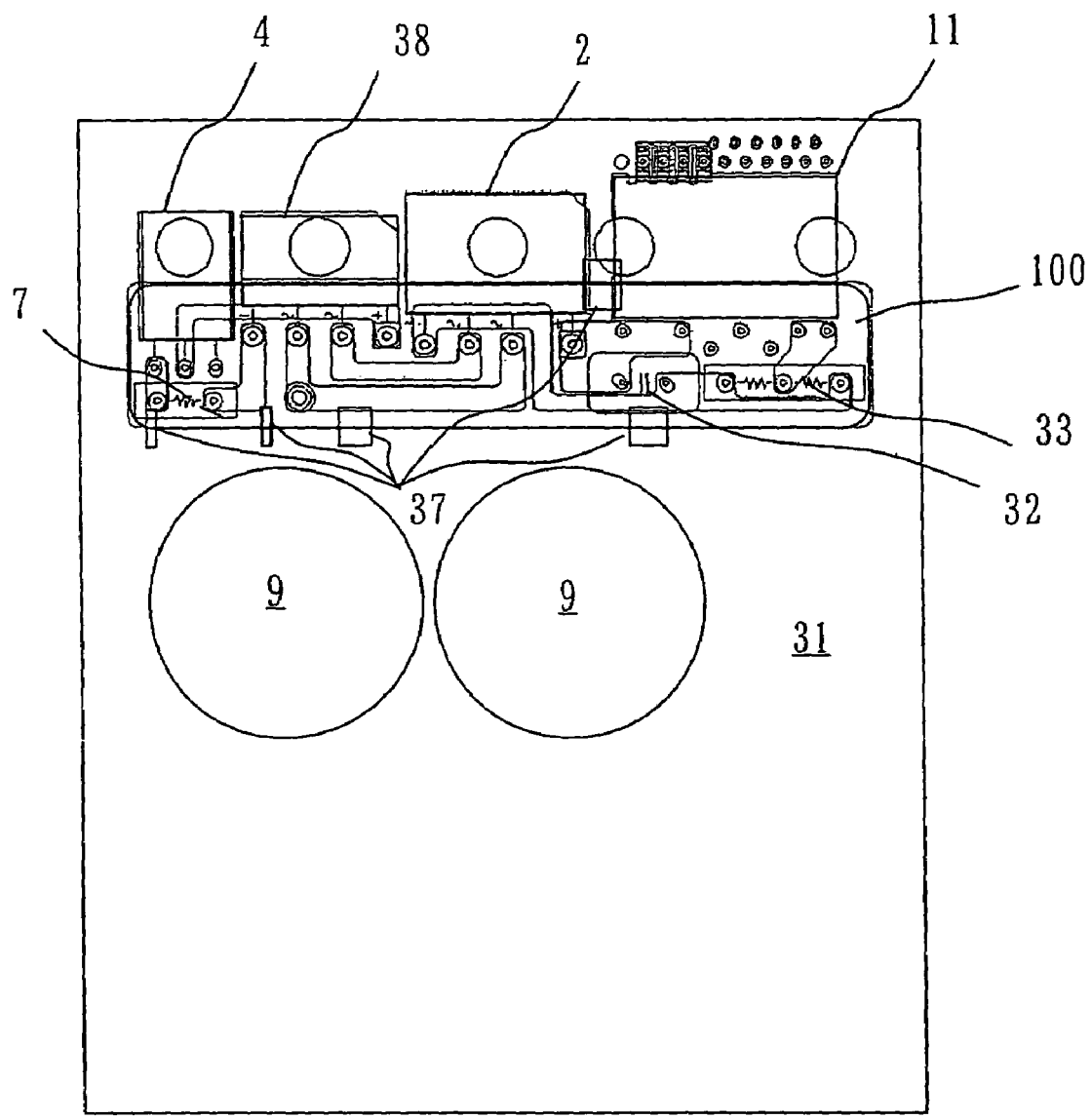
FIG. 7 A diagram describing the first embodiment, and is a plan view of the lead frame molded board 100 after bending the leads, and the single-sided printed circuit board 31.
Figure 8:
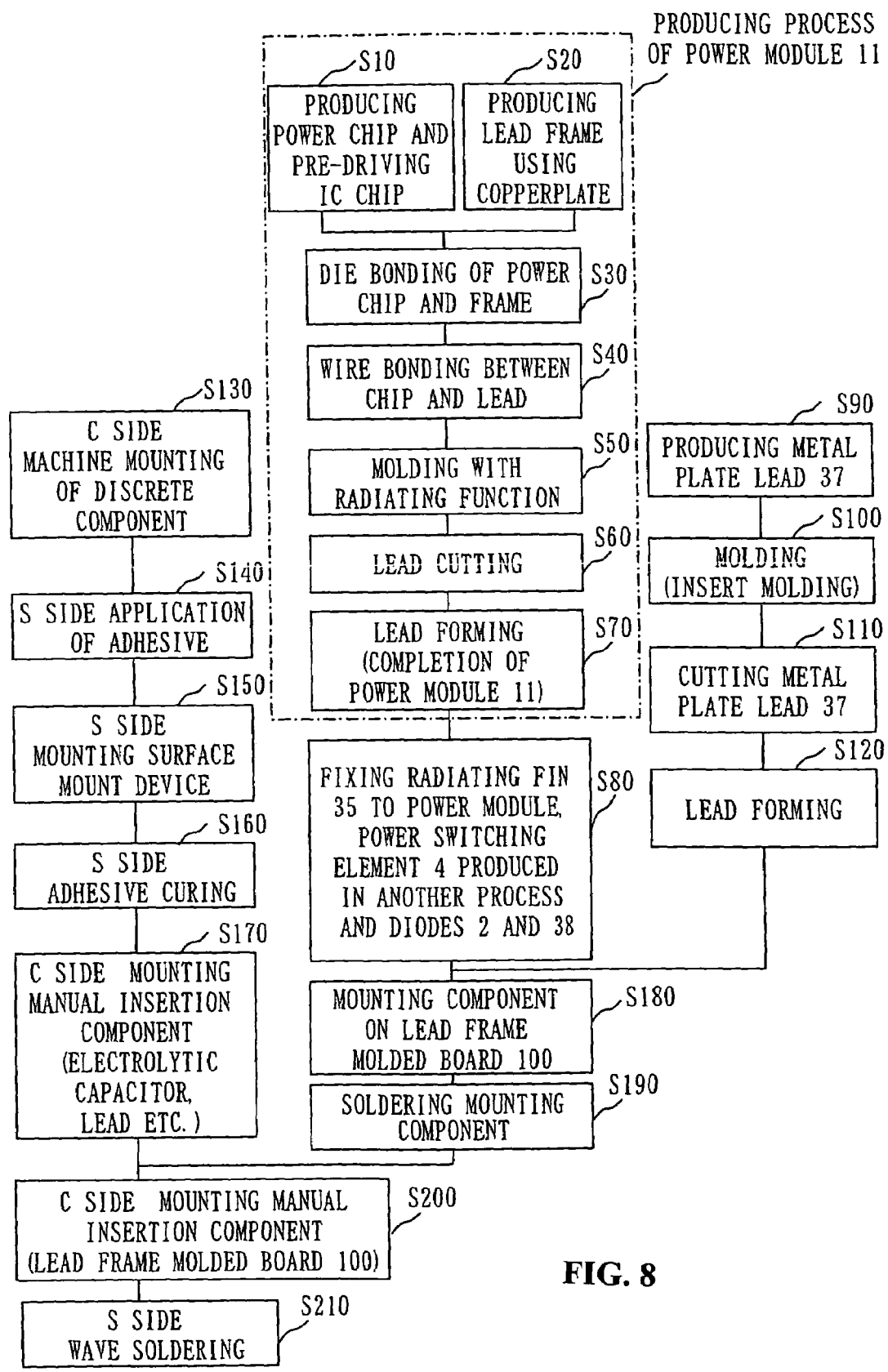
FIG. 8 A diagram describing the first embodiment, and is a diagram describing the production process of the motor drive circuit.

FIG. 1 through FIG. 8 are diagrams describing the first embodiment: FIG. 1 is a perspective diagram of an outdoor unit 200 for an air conditioner; FIG. 2 is an electric circuit diagram of a drive circuit 300 for a compressor motor which drives the compressor; FIG. 3 is a configuration diagram of electric components of the outdoor unit 200 for the air conditioner; FIG. 4 is a perspective diagram of an electrical component case 94; FIG. 5 is a perspective diagram of a conventional electrical component case 90 shown for comparison; FIG. 6 is a plan view of an arrangement of a lead frame molded board 100 before bending metal plate leads 37 and mounting devices; FIG. 7 is a plan view of the lead frame molded board 100 after bending the leads and a single-sided printed circuit board 31; FIG. 8 is a diagram describing a production process of a motor drive circuit.

As shown in FIG. 1, the outdoor unit 200 for the air conditioner houses a compressor 86 for compressing a refrigerant in a machine chamber 200a. The electrical component case 94 is established above the machine chamber 200a, and a radiating fin 35 for cooling the heat-generating devices is placed at a blower chamber 200b, to be cooled by a propeller fan 92. Further, an alternating-current reactor 3 as one of electronic components is fixed inside the machine chamber 200a. The blower chamber 200b is placed adjacent to the machine chamber 200a, which houses a heat exchanger 87 for performing heat exchange between the refrigerant and the air, and the propeller fan 92 for cooling the heat exchanger 87.

With reference to FIG. 2, it is explained the drive circuit 300 for the compressor motor (one example of the motor drive circuit) for driving a motor for the compressor 86 installed in the machine chamber 200a of the outdoor unit 200 for the air conditioner. The drive circuit 300 for the compressor motor consists of an inverter circuit 300a and a converter circuit 300b. In the drive circuit 300 for the compressor motor, the converter circuit 300b is connected to an alternating-current source 1, and a direct-current output of the converter circuit 300b is converted into an alternating current whose frequency is variable in the inverter circuit 300a, to drive a brushless direct-current motor 14 of the compressor 86.

The converter circuit 300b consists of the alternating-current reactor 3, a power switching element 4 connected to a bus via a diode bridge 38 and a shunt resistance 7, a diode bridge 2 and an electrolytic capacitor 9.

The inverter circuit 300a consists of a snubber capacitor 32, a shunt resistance 33 and a power module 11.

The power switching element 4 consists of an insulated-gate bipolar transistor (IGBT), a field effect transistor (FET), etc. for a converter. By switching the power switching element 4, power factor improvement, power supply harmonics removal, and step-up etc. are performed, a direct-current output outputted from the diode bridge 2 is switched using the power module 11, and the brushless direct-current motor 14 produces a revolving magnetic field and controls the rotation. The shunt resistance 33 converts an electric current flows in the power module 11 and the brushless direct-current motor 14 into a voltage, and based on the voltage, controls and protects, etc. the brushless direct-current motor 14 and the inverter circuit 300a. Similarly, the shunt resistance 7 converts a short-circuit current flows in the power switching element 4 into a voltage, and by using the voltage, controls and protects, etc. the power switching element 4 and the diode bridge 38.

When illustrating an overall structure of electric and electronic components used in the outdoor unit 200 for the air conditioner as shown in FIG. 3, they can be divided into components of a control circuit mounted on the single-sided printed circuit board 31 (one example of a printed circuit board), components of a power circuit mounted on the lead frame molded board 100, and components not mounted on the boards.

As will hereinafter be described in detail, the components of the power circuit making up the drive circuit for driving the brushless direct-current motor 14 for the compressor 86 shown in FIG. 2 are mounted on the lead frame molded board 100 as a characterizing part of the present embodiment. That is, the power module 11, the shunt resistance 7, the shunt resistance 33, the snubber capacitor 32, the diode bridge 2, the diode bridge 38 and the power switching element 4, etc. are mounted on the lead frame molded board 100.

The electronic components of the control circuit are mounted on the single-sided printed circuit board 31. However, the electrolytic capacitor 9 as a component of the power circuit is mounted not on the lead frame molded board 100, but on the single-sided printed circuit board 31, so as not to be heat affected by keeping it away from the power module 11 as a heat-generating component. Therefore, in the single-sided printed circuit board 31, only wirings of the electrolytic capacitor 9 and a noise filter 82 are high-voltage and high-current wirings.

In addition, the electrolytic capacitor 9 is the tallest among the mounting components on the printed circuit board, and by not mounting the electrolytic capacitor 9 on the lead frame molded board 100, there is an effect that it is possible to lower the height of the circuit board as a whole and reduce the substrate volume.

On the single-sided printed circuit board 31, the CPU 16, a terminal 80 for inputting commercial power, an actuator drive circuit 81, the noise filter 82, a control power source 83, a fan inverter 84 (high-voltage and low-current), and a communication circuit 85, etc are mounted. An explanation for them in detail is not a main subject, so it is omitted.

As components not mounted on the substrates, there are the alternating-current reactor 3 and the compressor 86 as mentioned before, and a fan motor 92a for driving the propeller fan 92.

The electrical component case 94 houses the single-sided printed circuit board 31 and the lead frame molded board 100. The configuration is explained below.

As shown in FIG. 4, the lead frame molded board 100, whereon the components of the power circuit are mounted, and the electrolytic capacitor 9 are mounted on a component side 31b of the single-sided printed circuit board 31. In FIG. 4, the power module 11, the snubber capacitor 32 and the shunt resistance 33 among the components mounted on the lead frame molded board 100 are described.

Further, the electronic components of the control circuit except the electrolytic capacitor 9 which are described in FIG. 3 are mounted on a solder side 31a of the single-sided printed circuit board 31. Among them, the CPU 16 is described in FIG. 4.

A radiating fin 35 placed outside the electrical component case 94 is fixed to the power module 11. The power switching element 4, the diode bridge 2 and the diode bridge 38, which are not described in FIG. 4, are fixed to the radiating fin 35.

Generally, plated copper or plated brass is used for the metal plate leads 37 of the lead frame molded board 100. As a method for processing the shape of the metal plate leads 37, punching, bending, wire cutting, laser processing, and etching etc. are used. A mold resin 36 contains the metal plate lead 37, and for the mold resin 36, a resin of nylon, unsaturated polyester, or epoxy etc. containing a filler, such as glass, is used mainly for the purpose of insulation. The metal plate leads 37 make up the lead frame molded board 100 in a planar or three-dimensional form, by insert molding, etc. with the mold resin 36.

Main high-voltage and high-current power terminals 30 of the power module 11 for an inverter are bonded to the metal plate leads 37 by welding with lead-free soldering, etc.

Further, some of the high-voltage and high-current power terminals 30 penetrate both of the lead frame molded board 100 and the single-sided printed circuit board 31, and are bonded to the both by soldering. Moreover, some of the power terminals 30 penetrate the lead frame molded board 100 without electrical connection, and are bonded to the single-sided printed circuit board 31 by soldering.

Further, main control wiring terminals 39 of the power module 11 for an inverter do not establish an electrical connection with the lead frame molded board 100, and are bonded to the single-sided printed circuit board 31 of a paper base material by welding of wave soldering, partial soldering, or robotic soldering, etc. with lead-free solder, etc. However, when the control wiring terminal 39 stretches to the lead frame molded board 100, the control wiring terminal 39 penetrates a hole on the lead frame molded board 100 with cross-sectional area larger than that of the control wiring terminal 39 so as not to establish an electrical connection, but to establish an electrical connection with the single-sided printed circuit board 31.

A projection 101 is formed on the lead frame molded board 100 made up of the metal plate leads 37 and the mold resin 36 to adjust the height of the power module 11, etc. For example, the projection 101 adjusts its height to the power switching element 4, the diode bridge 2 and the diode bridge 38 whereto the radiating fin 35 is fixed, so that it becomes easier to mount the radiating fin 35.

The lead frame molded board 100 whereon the electronic components such as the power module 11, etc. are mounted is mounted on the single-sided printed circuit board 31. Some of the metal plate leads 37 of the lead frame molded board 100 are bent to penetrate the single-sided printed circuit board 31, and are bonded to the single-sided printed circuit board 31 with a solder 103 by welding of wave soldering, partial soldering, or robotic soldering, etc. with a lead-free solder, etc.

FIG. 5 is a perspective diagram of the conventional electrical component case 90 shown for comparison. In the conventional electrical component case 90, all the electronic components are mounted on a double-sided printed circuit board 131. The electronic components of the power circuit, such as the power module 11, the snubber capacitor 32, the shunt resistance 33 and the electrolytic capacitor 9, and the electronic components of control circuit, such as the CPU 16, are mounted on the double-sided printed circuit board 131. The power module 11 is fixed to the radiating fin 35 placed outside the electrical component case 90, together with the power switching element 4, the diode bridge 2, and the diode bridge 38, which are not shown in the diagram. A resin spacer 34 for adjusting the height of the power module 11 is inserted between the power module 11 and the double-sided printed circuit board 131.

By the configuration as shown in FIG. 4, most of the electronic components of the power circuit are not bonded to a pattern on the single-sided printed circuit board 31, unlike in the conventional one as shown in FIG. 5, wherein all the electronic components are mounted on the double-sided printed circuit board 131. Therefore, it becomes less necessary to wire a high-voltage and high-current wiring, which requires a broad pattern width and a wide pattern-to-pattern spacing, on the single-sided printed circuit board 31. The electrolytic capacitor 9 as one of the electronic components of the power circuit is mounted on the single-sided printed circuit board 31 apart from the power module 11, so as not to be affected by heat of the power module 11 as a heat generating component, and shorten its life. In this regard, the electrolytic capacitor 9 is arranged near the lead frame molded board 100 to keep the metal plate leads 37 as high-voltage and high-current wirings on the single-sided printed circuit board 31 as short as possible.

It is possible to configure the small-sized electrical component case 94 without using the double-sided printed circuit board 131, which can increase the quantity of wirings, but is more than four times more expensive than the single-sided printed circuit board 31 of a paper base material. By miniaturization, it is possible to reduce materials for shell components of the electrical component case 94.

Further, the resin spacer 34 as shown in FIG. 5 becomes unnecessary since the projection 101 is formed on the lead frame molded board 100. Since the resin spacer 34 is generally inserted by hands, it is possible to reduce the assembling cost of a substrate as well.

Furthermore, the power terminals 30 of the power module 11 as a heat-generating component, whose level of heat shrinkage due to heat generation is the highest, are first bonded on the lead frame molded board 100, and then the metal plate lead 37 of the lead frame molded board 100 is bonded to the single-sided printed circuit board 31. Therefore, heat stress in each bonded part can be reduced by selecting bending form of the metal plate leads 37 and materials of the lead frame molded board 100, in comparison with directly bonding components with a printed circuit board.

Further, it is possible to mount major semiconductor components of the inverter circuit 300a and the converter circuit 300b at the time of mounting the other components on the single-sided printed circuit board 31, and it is possible to establish electrical connection at the time of soldering the single-sided printed circuit board 31 as in the other mounting components on the single-sided printed circuit board 31. Therefore, screwing of the power terminals 30, and wiring materials and wiring operations by connectors of the inverter circuit 300a and the converter circuit 300b become unnecessary, which leads to cost reduction and safety improvement.

Furthermore, since some of power terminals 30 are used for electrical connection with both the lead frame molded board 100 and the single-sided printed circuit board 31, material efficiency is improved.

With reference to FIG. 6, it is further explained the arrangement of the lead frame molded board 100 before bending the metal plate leads 37, and mounting components. In FIG. 6, the metal plate leads 37 composed of plated copper or plated brass are molded with the mold resin 36 to form the lead frame molded board 100. The power module 11, the snubber capacitor 32, the shunt resistance 33, the diode bridge 2, the diode bridge 38, the power switching element 4 and the shunt resistance 7, except the alternating-current reactor 3 and the electrolytic capacitor 9 among the electronic components of the power circuit are mounted on the metal plate leads 37.

Some of the power terminals 30 (shown enclosed with a dotted line in FIG. 6) of the power module 11 are connected to the metal plate leads 37, meanwhile, the other power terminals 30 and the control wiring terminals 39 (shown enclosed with a dotted line in FIG. 6) are connected to the single-sided printed circuit board 31.

Further, the power switching element 4 also includes the power terminal 30 and the control wiring terminal 39, wherein the power terminal 30 is connected to the metal plate lead 37, and the control wiring terminal 39 is connected to the single-sided printed circuit board 31.

As shown in FIG. 7, on the single-sided printed circuit board 31, the power module 1, the snubber capacitor 32, the shunt resistance 33, the diode bridge 2, the diode bridge 38, the power switching element 4 and the shunt resistance 7, except the alternating-current reactor 3 and the electrolytic capacitor 9 among the electronic components of the power circuit, are mounted, and further, the lead frame molded board 100 wherein the metal plate leads 37 are bent, and the electrolytic capacitor 9 are mounted.

The lead frame molded board 100 is, as shown in FIG. 7, small in size, which is less than or equal to a half size of the single-sided printed circuit board 31, and is arranged parallel to the single-sided printed circuit board 31 and at near the end of a long axis of the single-sided printed circuit board 31 in relation to the center of the single-sided printed circuit board 31. Additionally, a long axis of the lead frame molded board 100 is arranged in a shorter direction of the single-sided printed circuit board 31, as shown in FIG. 7.

The metal plate leads 37 are bent to penetrate the single-sided printed circuit board 31 from the component side 31b to the solder side 31a. Further, the electrolytic capacitor 9 is arranged at a position near the penetrating metal plate leads 37. This intends to keep the power wiring on the single-sided printed circuit board 31 as short as possible. Since the electrolytic capacitor 9 is large in height, the electrolytic capacitor 9 is arranged at an opposite side of the power switching element 4, etc. to shorten the power wiring on the single-sided printed circuit board 31, and at the same time is arranged at the other side of the radiating fin 35 (not shown in FIG. 7) placed on the power devices, in relation to the lead frame molded board 100, to increase volumetric efficiency. Further, the life of the electrolytic capacitor 9 is highly temperature dependent. To extend the life at the same temperature of the electrolytic capacitor 9 as an expensive component is not cost-effective. For this reason, by arranging the electrolytic capacitor 9 according to the present embodiment, the electrolytic capacitor 9 is kept apart from the heat-generating components to extend its life. Further, by mounting the shunt resistance 7 and the shunt resistance 33 for current detection on the lead frame molded board 100, it is possible to significantly reduce dimension and capacity of the electrical component case 94 carrying the single-sided printed circuit board 31 whereon the other components are mounted, and the present circuit. In addition, it is possible to lower noise by reducing inductance in the power wiring. Furthermore, it is possible to improve reliability of the circuits and the devices against a solder crack, etc.

Further, it is possible to establish a bulkhead (not shown) between the radiating fin 35 and the electrolytic capacitor 9 only by changing a shape of a die at the time of producing the lead frame molded board 100 by die molding without using additional components, and to easily decrease the ambient temperature of the electrolytic capacitor 9 by insulating heat with the bulkhead. By decreasing the ambient temperature of the electrolytic capacitor 9, it is possible to extend the life of the electrolytic capacitor 9, which is a bottleneck for life of an inverter circuit due to drying up of electrolytic solution, etc. by the ambient temperature, and to extend the life of a motor drive circuit and an air conditioner carrying the same.

With reference to FIG. 8, it is explained a production process of a motor drive circuit. Steps S10 through S70 are a production process of the power module 11.

Step S10 indicates a production of a power chip, and indicates a production of a power device silicon chip, such as a metal-oxide semiconductor field-effect transistor (MOSFET), an insulated gate bipolar transistor (IGBT), a diode, etc., and a silicon chip such as a pre-driving IC, etc., using a semiconductor process. It is of course possible to use a silicon carbide chip, etc., whose developments has been active as a next-generation power device in recent years.

Step S20 shows a production of a metal (for example, copper) lead frame for the purposes of: (1) retrieving an electrical signal outside the IC package of the power chip produced in S10; and (2) releasing heat in a heat pool generated by the chip of the power chip produced in S10 outward. The step S20 is made up mainly of a punching step and a plating step of a sheet metal.

Step S30 shows a die-bonding step for bonding the power chip produced in S10 to the lead frame produced in S20 with a solder.

Step S40 shows a wire bonding step for establishing electrical connection between an electrode on an upper surface of a Si chip and a lead using ultrasonic bonding with a wire of aluminum, gold, etc. For an inverter IC, a direct bonding method is used, wherein silicon chips are connected directly by an aluminum wiring, which enables improvement of area efficiency and minimization of lead frame materials and sealing resin materials. When using this method, an inverter IC can be minimized.

Step S50 is a molding step for performing insert molding using the lead frame whereon the power chip is mounted, a metal heat splitter, and an epoxy resin including silica filler, etc. with high insulation property and high radiation property. The IC chip of which the bonding is completed is sealed in a package or with a sealing material to prevent it from being scratched and shocked. It is generally used a transfer molding method excelling in cost and productivity, for an inverter IC for driving an air conditioner motor.

Step S60 is a lead cutting step for cutting unnecessary leads of the power module 11 of which the insert molding is completed in S50.

Step S70 is a lead forming step for bending the leads of the power module 11 in the most suitable form for board mounting.

Step S80 is a fixing step of the radiating fin 35 to the power module 11 whereof the lead forming is completed, and the power switching element 4, the diode bridge 2 and the diode bridge 38 produced in the other steps. In this step, generally a film is inserted or grease is applied between the members on both sides to increase adhesiveness, to lower thermal resistance and to reduce variations between the members on both sides.

Step S90 shows production of the metal plate leads 37 to be used for the lead frame molded board 100 for connecting the power module 11 and the power switching element 4, etc. to the single-sided printed circuit board 31. The step is made up mainly of a punching step and a plating step of a sheet metal.

Step S100 is a molding step for performing insert molding of the metal plate leads 37 produced in S90 with a resin having a higher insulation property and a higher allowable temperature limit than a printed of a paper phenol, etc.

Step S110 is a lead cutting step for cutting unnecessary metal plate leads 37 of the lead frame molded board 100 whereof the insert molding is completed in S100.

Step S120 is a lead forming step for bending the metal plate leads 37 of the lead frame molded board 100 in the most suitable form for mounting on the single-sided printed circuit board 31.

Step S130 is a machine mounting step for mounting a discrete component on the component side 31*b* (C side) of the single-sided printed circuit board 31 of a paper-phenol base material, etc. whereon a copper foil wiring of about 40 μm is formed by etching, and whereon a drilling process is performed, by using an automatic feeding machine. The discrete component is a component with a lead having a certain height, mounted on a component side 31*b*, whereof the lead penetrates the substrate, and is soldered to the solder side 31*a*. As an example, there are a resistance, a capacitor, an IC, and a jumper wire for connecting between patterns, and the like.

Step S140 is an adhesive application step for applying an adhesive to fix surface mount devices after they are mounted on the solder side 31*a* (S side) of the single-sided printed circuit board 31 of a paper-phenol base material, etc. whereon the discrete components are mounted by machine in S130, by using an automatic machine. The surface mount devices are components small in height, for example, a microcomputer, an IC, a diode and a resistance, etc.

Step S150 is a machine mount step for mounting the surface mount devices on the solder side 31*a* of the single-sided printed circuit board 31 of a paper-phenol base material, etc. whereto application of the adhesive is completed in S140, by using an automatic feeding machine.

Step 160 is an adhesive curing step for curing the adhesive applied in S150, and fixing the surface mount devices after they are mounted on the solder side 31*a* of the single-sided printed circuit board 31.

S170 is a manual insertion step for manually mounting the electrolytic capacitor 9 and the lead wire, etc. on the single-sided printed circuit board 31 whereon the adhesive curing is completed in S160.

Step S180 is a mounting step for mounting the power module 11, the power switching element 4, the shunt resistance 7, the shunt resistance 33, the diode bridge 2, the diode bridge 38 and the snubber capacitor 32, whereto the radiating fin 35 is fixed in S80, on the lead frame molded board 100 whereof the unnecessary parts of the lead frames are cut and whereto the lead forming is performed in S120.

Step S190 is a soldering step of mounting components for bonding the electronic components mounted in S180 and the metal plate leads 37 of the lead frame molded board 100.

Step S200 is a manual insertion step for manually mounting the lead frame molded board 100 and the mounting components following the component mounting in S170 on the single-sided printed circuit board 31.

Step S210 is a wave soldering step for soldering the solder side 31*a* (S side) of the single-sided printed circuit board 31 whereof mounting of all the components is completed, with a jet solder, etc.

Further, in recent years, for the purpose of reducing cost by reducing materials of the power module 11 and reducing a mounting area, it becomes popular to narrow terminal-to-terminal spacings and to apply a silicon resin having fluidity and insulation property to a joint part of a printed circuit board and a high-voltage terminal after they are joined. However, lead wiring is so designed at a distance that application of silicon on the lead frame substrate is unnecessary, and application of the silicon resin on the printed circuit board is unnecessary. There is concern about a silicon resin that its linear expansion coefficient does not meat that of leads of the electronic components so that in the power components, the silicon resin holds up or pulls back the electronic components bonded to the printed circuit board, causing metallic fatigue in solder joints and shortening the life of the circuit, or in high-current wiring parts, increasing the temperature at the joints due to loose contact. Further, when producing a lead frame substrate by die molding, it is possible to establish a bulkhead with a mold resin at the time of molding a substrate, only by changing a shape of a die without using new components additionally between high-voltage wirings, and it is unnecessary to apply a silicon resin, etc. around the joint parts of the lead frame substrate and high-voltage terminals of the electronic components after they are joined. Thus, it is possible to eliminate silicon application, which is expensive and has low reliability due to human operations, and to make the above improvement by automation using a die. The resin bulkhead between the pins is also effective against failures due to a short circuit induced by a whisker, which grows from leads of semiconductor components in a hairlike form to cause failures due to a short circuit, and which has become a problem recently.

In a conventional printed circuit board and metal substrate, etching is used for forming a copper foil wiring. Therefore, when forming a wiring for a power wiring of a thick copper foil, etching time is required and unit cost of boards is increased. When formed on the same board, even a fine wiring such as a control wiring will be made of a thick copper foil, which results in use of unnecessary materials. In the present invention, by wiring a part of the power wiring on the lead frame molded board 100, it is possible to miniaturize the single-sided printed circuit board 31, and to use a copper foil with a thickness most appropriate for the control wiring, not for the power wiring. Therefore, it is possible to optimize the productivity of the single-sided printed circuit board 31 and the entire control circuit economically.

Further, by making only a power part whose component shape and cycle of wire changing is long to be mounted on a lead frame (mounted on the lead frame molded board 100), and by making the other electronic components to be hand insertion components and manually mounting them on the single-sided printed circuit board 31 wherein changing of wirings and mounting components is possible with a small investment, it is possible to support model change with flexibility.

In an IC encapsulating method, such as a transfer molding, not only a high insulation property but also a high radiation property is required for a resin material. Therefore, a filler such as ultrapure silica-aluminum, etc. having a high radiation property and containing only a small amount of impurities to prevent erosion of an aluminum wiring, etc. of a chip is used as a resin material. Thus, to reduce the cost of an IC itself, it is inevitable to eliminate redundant parts, such as to shorten wiring distance or insulating distance from chips to leads. That is, reduction of the price of the IC itself inevitably results in a pin assignment unsuitable for wiring of a printed circuit board. Therefore, it is necessary to increase quantity of wirings on the printed circuit board, and there are problems that it becomes uneconomical as a whole, and developmental noise increases due to increase of a lead inductance since wirings on the printed circuit board cross with one another and are redundant. By the producing process according to the embodiment of the present invention, it is possible to reduce the quantity of wirings on a printed circuit board while using a low-cost transfer molded IC, and to obtain an economical and low-noise circuit.

Further, in a transfer molded IC, it is inevitable to use an expensive and special die due to resin constraint, and it is necessary for an IC circuit configuration to have versatility. When circuits of both the inverter circuit 300a and the converter circuit 300b for an air conditioner are realized in an IC on the same package, it becomes less versatile and it is impossible to ensure enough quantity to get a return on investment in the expensive die. In the embodiment of the present invention, it is possible to use electronic components, such as the diode bridge 2, the diode bridge 38, the power switching element 47, etc. especially for the converter circuit 300b as well as the inverter IC using transfer molding, which are used with versatility and in a large amount in products except an air converter such as a switching supply, a television, an inverter lighting, a microwave oven, an inverter for induction heating and a voltage converter for photovoltaic generation, which results in an economical configuration as a whole.

In the embodiment of the present invention, it is possible to make redundant wirings on the single-sided printed circuit board 31 unnecessary, and to enhance effects of economic efficiency and low noise due to lowering inductance through minimizing an IC, by realizing a power wiring on the lead frame molded board having a spacer function in a motor drive circuit using the economical inverter IC by a direct bonding method and a transfer molding method, wherein the inverter IC is minimized, and by forming a subassembly which can be inserted in the single-sided printed circuit board 31 and making them electrically connectable with soldering.

Further, the lead frame molded board 100 has only to be located in the surrounding area of high-voltage and high-current terminals of the power devices, and the area of the lead frame molded board 100 can be minimized. Therefore, it is possible to miniaturize the size of the die and the molding machine, which occupies most of the production cost of the lead frame molded board 100. Moreover, since the fact that the lead frame molded board 100 small in size suffices also means that when a plurality of units are removed from one die, the demolded number is increased, productivity of the boards can be improved.

In the production process shown in FIG. 8, in comparison to a production process of a conventional circuit, a mounting step of a surface mount device on and a soldering step of the surface mount device to the component side 31b (C side) of the single-sided printed circuit board 31 are cut, so that elimination of the steps themselves and restraint of investment in production facilities and tools can be sought. Further, it is possible to mount major semiconductor components of the inverter circuit 300a and the converter circuit 300b at the time of mounting the other components on the single-sided printed circuit board 31, and further it is possible to establish electrical connection at the time of soldering the single-sided printed circuit board 31 as in the other mounting components on the single-sided printed circuit board 31. Therefore, screwing of the power terminals 30, and wiring materials and wiring operations by connectors of the inverter circuit 300a and the converter circuit 300b become unnecessary, which leads to cost reduction and safety improvement.

Further, in the conventional production step, since thermal resistance between wiring leads of the power module 11, the power switching element 4, the diode bridge 2 and the diode bridge 38, etc. and the fixing surface of the radiating fin is small, when a wave soldering is performed in a state in which the radiating fin 35 is fixed, the leads of the components is thermally bound to the radiating fin 35 having low thermal resistance and extremely large heat capacity, so that the solder does not spread well. Therefore, it is impossible to perform wave soldering to the power module 11, the power switching element 4, the diode bridge 2, the diode bridge 38, etc. in a state in which the radiating fin 35 is fixed. Thus, there is a need for some extra steps in a wave soldering, such as to put on a weight to prevent components from uplifting, and to remove the weight after soldering.

In the present embodiment, the wiring leads of the power module 11, the power switching element 4, the diode bridge 2, the diode bridge 38 are thermally bound to the single-sided printed circuit board 31 via the metal plate leads 37 of the lead frame molded board 100. Therefore, it is possible to raise the thermal resistance between a joint of the radiating fin 35 and the single-sided printed circuit board 31, and to perform wave soldering with the radiating fin 35 fixed. Thus, the radiating fin 35 as a heavy load also functions as an uplift prevention, and the extra steps such as to put on a weight to prevent uplifting of the components and to remove the weight after soldering become unnecessary.

Further, since it is possible to fix the radiating fin 35 before mounting on the single-sided printed circuit board 31, the radiating fin 35 can be fixed, and screwing thereof can be performed without being near a component vulnerable to shock, etc., such as a surface mount capacitor. Therefore, it becomes easy to craft, and possible to prevent decrease of reliability due to breakage of components, such as a short circuit induced by a crack in a surface mount capacitor at the time of manufacturing.

Additionally, it is unnecessary to establish a screw hall on the single-sided printed circuit board 31 to fasten a screw for fixing to the radiating fin 35, and an usable area of the single-sided printed circuit board 31 is increased.

Further, by configuring the outdoor unit 200 for the air conditioner as FIG. 1, a portion of the electrical component case 94 sticking out of the machine chamber 200a becomes smaller than the conventional electrical component case 94 using the double-sided printed circuit board 131 as shown in FIG. 5. Therefore, it is possible to enlarge an usable area of the heat exchanger 87, to decrease pressure loss in an air trunk of the propeller fan 92, and to enhance product efficiency within a same capacity of the outdoor unit.

Although it is explained above a motor drive circuit to be used for the compressor 86 of the outdoor unit 200 of the air conditioner, it is without saying that a similar effect can be obtained by applying it to devices using a semiconductor for a high-voltage and a high-current power conversion, such as a power converter for a photo voltaic system, a power converter for lighting, an induction heating-type thermal appliance (a rice cooker, a built-in cooking heater), etc.

Embodiment 2

Figure 9:
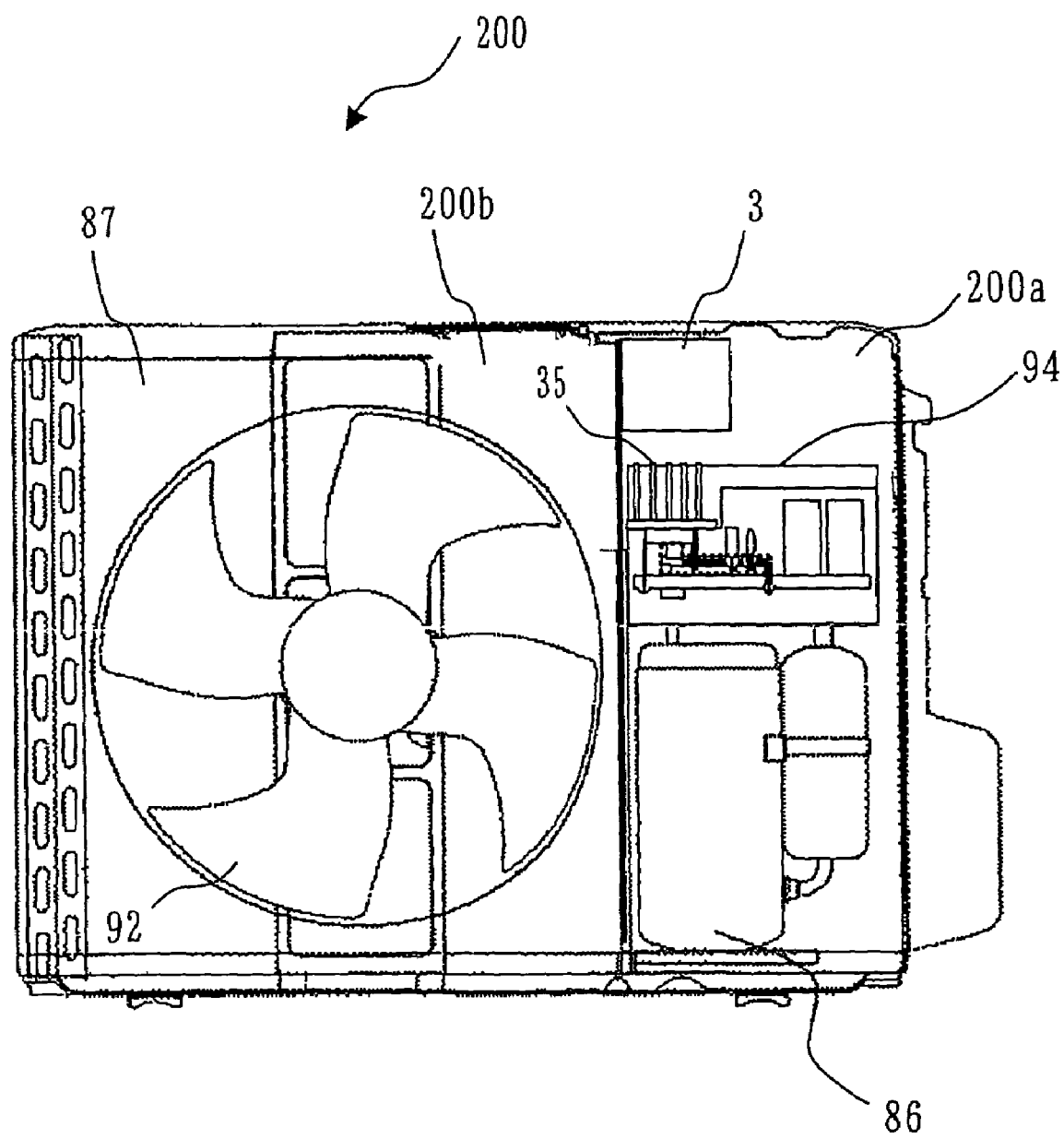
FIG. 9 A diagram describing the second embodiment, and is a perspective diagram of the outdoor unit 200 for the air conditioner.

FIG. 9 describes the second embodiment, and is a perspective diagram of the outdoor unit 200 for the air conditioner.

In the first embodiment, although it is indicated one using the single-sided printed circuit board 31 for a printed circuit board, it is also possible to use a double-sided printed circuit board (one example of a printed circuit board) for a printed circuit board. In a case of the double-sided printed circuit board, an area of the printed circuit board can be about a half size of that in a case of using the single-sided printed circuit board 31.

In a 2 kW AC air conditioner, a single-sided printed circuit board 31 generally with a size of about 160 mm×250 mm may corresponds to a double-sided printed circuit board with a size of 141.5 mm×141.5 mm in a shape of square. As shown in FIG. 9, the electrical component case 94 fits inside a layout area (in the machine chamber 200a) of the upper part of the compressor 86 in the outdoor unit 200 for the air conditioner, and it is possible to directly mount the electrical component case 94 above the compressor 86. Therefore, the portion of the electrical component case 94 sticking out of the machine chamber 200a gets smaller, so that an usable area of the heat exchanger 87 increases, pressure loss in the air trunk in the propeller fan 92 decreases, and product efficiency within the same capacity of the outdoor unit is enhanced.

Further, since it is possible to mount the electrical component case 94 on the compressor 86 directly, vibration of the compressor 86 is detectable directly by the motor drive circuit if a biaxial acceleration censor for surface mounting is mounted on the double-sided printed circuit board. Since it is directly detectable, it is possible to directly restrain the vibration of the compressor 86 irrespective of whatever outdoor unit 200 for the air conditioner a combination of the compressor 86 and the electrical component case 94 is mounted on. Therefore, it is unnecessary to design and adjust for vibration absorption for each combination.

Furthermore, there has hitherto been an attempt to directly mount a motor drive circuit on the compressor 86. However, the electrical component case 94 is not small enough to be mounted on the upper surface of the compressor 86, so that it has been impossible to mount the electrical component case 94 on a position where vibration is detectable sensitively. By using the motor drive circuit according to the present invention, it is possible to miniaturize the area of the electrical component case 94, and to attach the electrical component case 94 on the upper surface of the compressor 86. In addition, since the compressor 86 is generally fixed its bottom surface, it is possible to mount the electrical component case 94 at a position on the upper surface of the compressor where high sensitivity to vibration detection is assured, to directly detect vibration on the upper surface of the compressor 86 by the biaxial acceleration censor, and to control vibration restraint, so that a low-vibration air conditioner can be obtained. Further, by making it possible to lower vibration, it is possible to reduce stress in soldering parts of the circuit in the electrical component case 94, and in lead wires for connecting the electrical component case 94 to an external source, etc. induced by the vibration of the compressor 86 so far, and to obtain a highly-reliable air conditioner, while the electrical component case 94 being mounted on the compressor 86.

Embodiment 3

Figure 10:
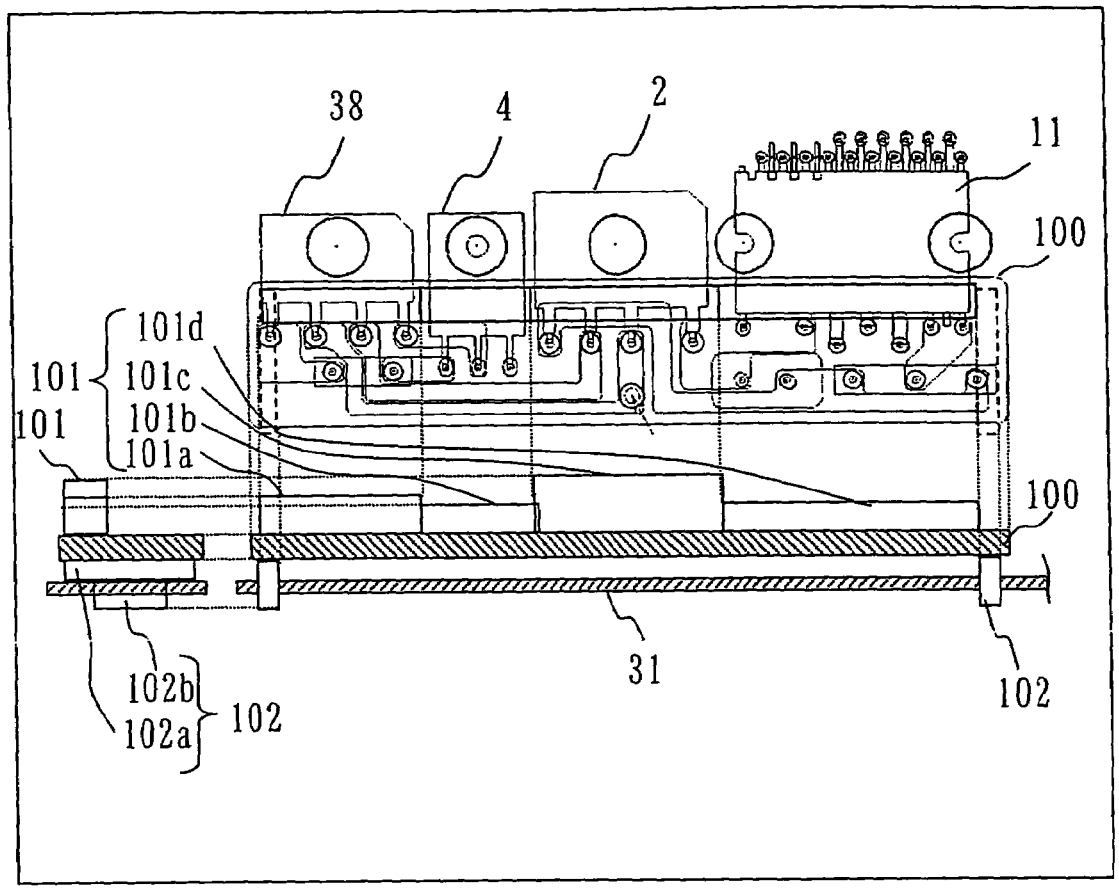
FIG. 10 A diagram describing the third embodiment, and is a three orthographic view describing the arrangement of the lead frame molded board 100, the mounting components and the printed circuit board.

FIG. 10 is a diagram describing the third embodiment, and a three orthographic view describing arrangement of the lead frame molded board 100, the mounting components and the single-sided printed circuit board 31.

It is stated above that the projections 101 are established on the lead frame molded board 100 to adjust the height with the power switching element 4, the diode bridge 2, and the diode bridge 38 whereto the radiating fin 35 is fixed, so that the radiating fin 35 can be easily fixed, and the detailed explanation thereof is described below. As shown in FIG. 10, the diode bridge 38, the power switching element 4, the diode bridge 2 and the power module 11 are linearly mounted in this order on the lead frame molded board 100 in the longer direction. Each of these elements has a different thickness of the package. If the upper surfaces of the packages are adjusted at the height of the surface of the radiating fin 35, the lower surfaces of the packages will vary in height against the metal plate leads 37 molded inside the lead frame molded board 100. Therefore, it is necessary to establish the projections 101 on the lead frame molded board 100 to adjust the heights.

In the present embodiment, the projections 101 as spacers for adjusting the height of the back surface of each component are connected from end to end in a longer direction of the component side of the lead frame molded board 100. The projection 101a corresponds to the diode bridge 38; the projection 101b corresponds to the power switching element 4; the projection 101c corresponds to the diode bridge 2; and the projection 101d corresponds to the power module 11.

By configuring in this way, it appears that ribs of resins are attached in the longer direction of the lead frame molded board 100. In this configuration, each projection can function as reinforcing the long axis of the lead frame molded board 100 whose warpage is of concern, and also as a spacer. Both functions can be attained with a small amount of resin, and it is possible to keep cost low on the lead frame molded board 100 itself, and to produce a warp-resistant substrate.

Further, as shown in FIG. 10, by inserting the projection 102a between the single-sided printed circuit board 31 and the lead frame molded board 100 in a shorter direction of the lead frame molded board 100 from end to end, it is possible for the same resin to function both as a spacer and as a reinforcing against a warp, to keep material cost low, and to produce a warp-resistant substrate.

Moreover, by establishing another projection 102b (as a projection 102) over the projection 102a to engage with a hole formed in the single-sided printed circuit board 31, it is possible to determine position in mounting the lead frame molded board 100 on the single-sided printed circuit board 31. Further, by engaging the projection 102b with the single-sided printed circuit board 31 first, it is possible to enhance insertability of component leads to the single-sided printed circuit board 31, to shorten mounting time at the time of manufacturing, to reduce insertion error of the component leads, and to enhance reliability.

In the present embodiment, the projection 101 of the mounting components is arranged in the longer direction of the lead frame molded board 100, and the projection 102 of the single-sided printed circuit board 31 in the shorter direction of the lead frame molded board 100. However, it is without saying that a similar effect can be obtained even if they are arranged in the opposite directions.

Furthermore, by establishing the projection 101 and the projection 102, it is possible to provide reinforce against a warp. Therefore, it is possible to thin the parts other than the projection 101 and the projection 102, and to reduce lead frames including the metal plate leads 37 and the resin materials.

Figure 17:
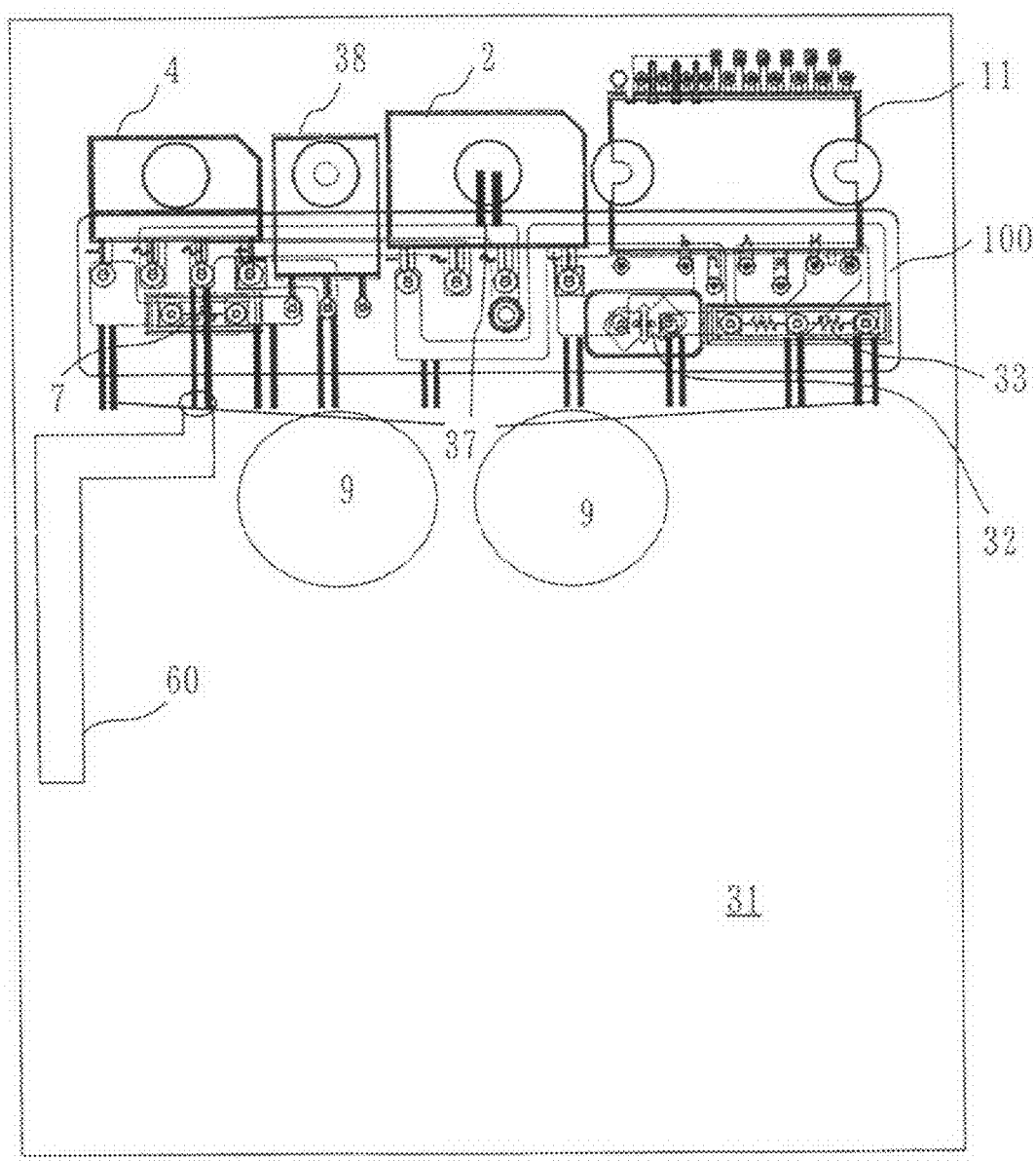
FIG. 17 A diagram describing the ninth embodiment, and is a plan view of the lead frame molded board 100 after bending the lead, and the single-sided printed circuit board 31.

Further, by arranging the diode bridge 38 at an end of the long axis of the lead frame molded board 100, it is possible to arrange the high-voltage alternating-current power wiring 60 on an opposite side of the alternating-current reactor 3 on the single-sided printed circuit board 31 at an end (refer to FIG. 17). When the high-voltage alternating-current power wiring 60 on the opposite side of the alternating-current reactor 3, which requires a wide pattern-to-pattern spacing on the single-sided printed circuit board 31, is at a center part of the single-sided printed circuit board 31, it is necessary to keep insulation distance from wirings on both sides. However, by arranging it at the end, it is enough if insulation distance is kept only from wirings on one side, and it is possible to reduce the area of the single-sided printed circuit board 31 necessary to ensure insulation distance, and to use the substrate efficiently.

Embodiment 4

Figure 11:
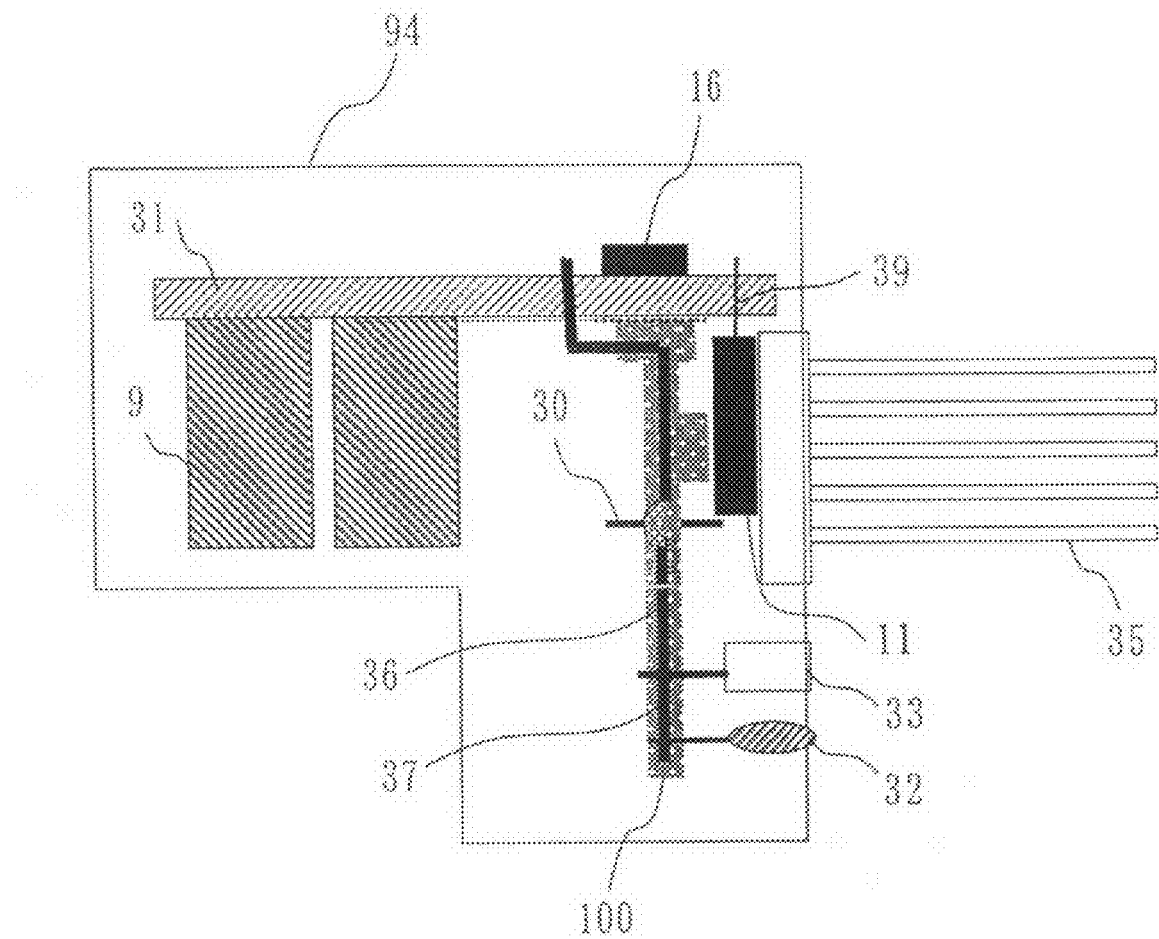
FIG. 11 A diagram describing the fourth embodiment, and is a perspective diagram of the electrical component case 94.

FIG. 11 is a diagram describing the fourth embodiment, and is a perspective diagram of the electrical component case 94. In the first embodiment, the power devices such as the power module 11, and the lead frame molded board 100 are mounted parallel to the single-sided printed circuit board 31. In this embodiment, the lead frame molded board 100 and the power devices are mounted at an right angle with the single-sided printed circuit board 31. In this arrangement, the layout area of the power devices on the single-sided printed circuit board 31 is reduced, and it is possible to further reduce the area of the single-sided printed circuit board 31 in comparison with the first embodiment.

Embodiment 5

Figure 12:
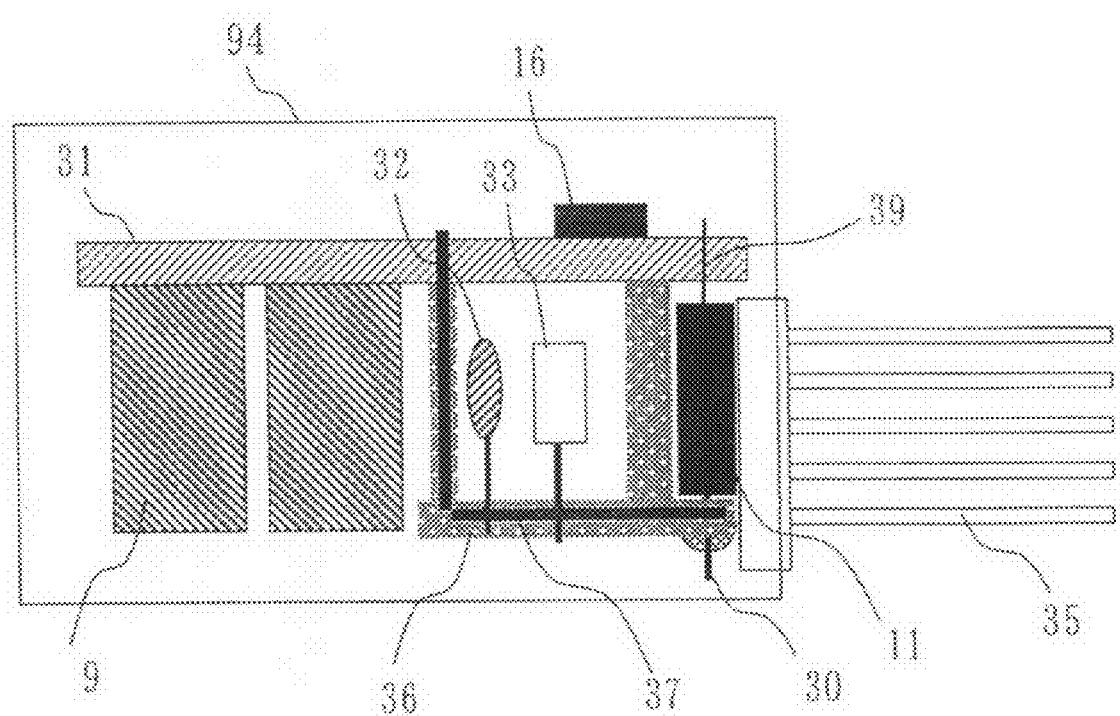
FIG. 12 A diagram describing the fifth embodiment, and is a perspective diagram of the electrical component case 94.

FIG. 12 is a diagram describing the fifth embodiment, and is a perspective diagram of the electrical component case 94. In the first embodiment, the power devices such as the power module 11 and the lead frame molded board 100 are mounted parallel to the single-sided printed circuit board 31. In this embodiment, only the power devices are mounted at an right angle with the single-sided printed circuit board 31. Also in this arrangement, the layout area of the power devices on the single-sided printed circuit board 31 is reduced, and it is possible to further reduce the area of the single-sided printed circuit board 31 in comparison with the first embodiment.

Further, in the present embodiment, both the control wiring terminals 39 of the power module 11 and the power terminals 30 stretch straight, so that there are effects that the lead forming step (S120) in FIG. 8 becomes unnecessary, and it is possible to reduce process cost of devices during the production process of the power module 11.

Embodiment 6

Figure 13:
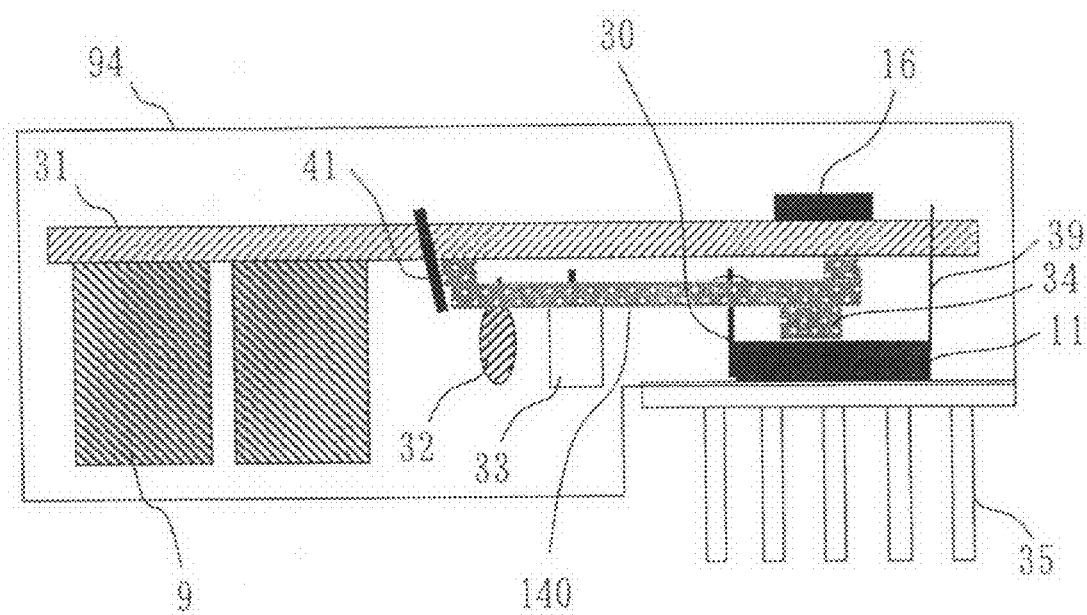
FIG. 13 A diagram describing the sixth embodiment, and is a perspective diagram of the electrical component case 94.

FIG. 13 is a diagram describing the sixth embodiment, and is a perspective diagram of the electrical component case 94. In the first to fifth embodiments, the lead frame molded board 100 is used for a mounting board of the power devices. However, it is without saying that it is possible to obtain the effect that the wiring area of the single-sided printed circuit board 31 is reduced, by using the double-sided printed circuit board 140 whereon a lead terminal 41 and a resin spacer 34 for joining boards are mounted. Although the double-sided printed circuit board 140 is used, it is also possible to use a multi-layer printed circuit board.

Embodiment 7

Figure 14:
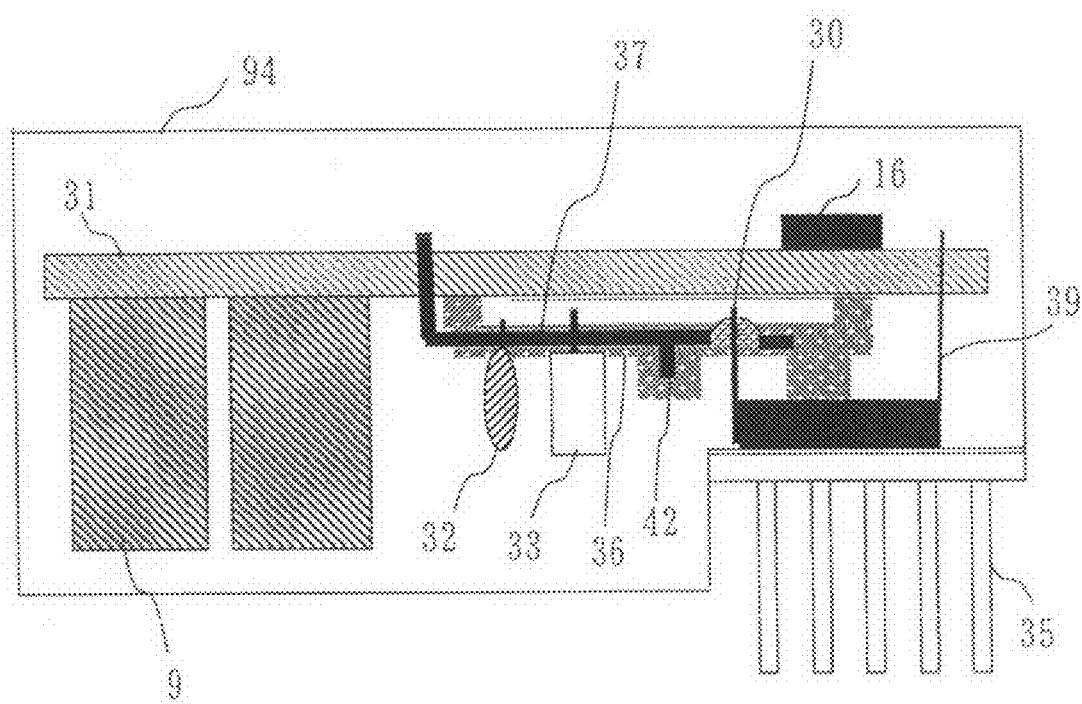
FIG. 14 A diagram describing the seventh embodiment, and is a perspective diagram of the electrical component case 94.

FIG. 14 is a diagram describing the seventh embodiment, and is a perspective diagram of the electrical component case 94. In the present embodiment, a connector 42 to establish a wire connection between the power module 11 and the brushless direct-current motor 14 on the lead frame molded board 100 is formed at the time of molding the board. This makes a connector for connecting with the brushless direct-current motor 14 mounted on the single-sided printed circuit board 31 unnecessary.

Embodiment 8

Figure 15:
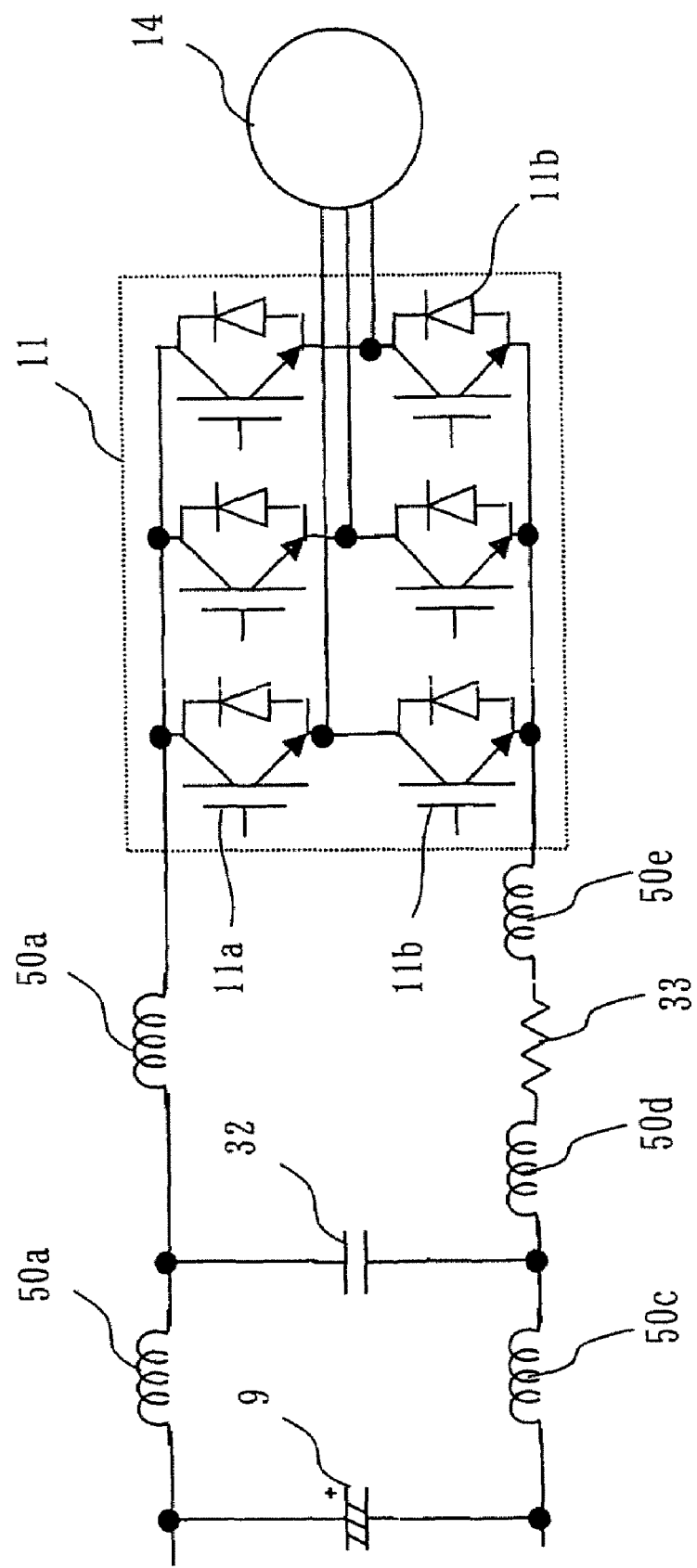
FIG. 15 A diagram describing the eighth embodiment, and is a circuit diagram around the inverter.

FIG. 15 is a diagram describing the eighth embodiment, and is a circuit diagram around the inverter. This diagram is to describe the circuit diagram in FIG. 2 in detail by including line impedance of the circuit board. In FIG. 15, the electrolytic capacitor 9, the snubber capacitor 32, the shunt resistance 33 and the power module 11 are the same as those in FIG. 2. The power module 11 consists of six switching elements 11a and a diode 11b. Further, inductances 50a to 50e exist as components of wiring lines as shown in FIG. 15.

When configuring the circuit of FIG. 15 only with a sheet of a general single-sided printed circuit board 31, in a 2 kW inverter, line length of the inductance 50b, the inductance 50d, and the inductance 50e is about 100 mm. Meanwhile, in the first to seventh embodiments, another substrate (the lead frame molded board 100) exclusive for power wirings is used, whereon the shunt resistance 33 and the snubber capacitor 32 are mounted, so that it is possible to make the wiring length about 10 mm. In the present embodiment, the line length is about one-tenth that of, and the inductance 50a to 50e in the lines is also one-tenth that of the conventional circuit.

When the switching element 11a is turned ON, electric charge stored under forward bias in the diode 11b flows through the shunt resistance 33, the inductance 50b, the inductance 50d and the inductance 50e, and is absorbed by the snubber capacitor 32. At this time, a resonance occurs between the inductance 50b, the inductance 50d, or the inductance 50e, and the snubber capacitor 32. The occurrence time of resonance depends on the inductance 50b, the inductance 50d and the inductance 50e, wherein the smaller the inductance is, the shorter the occurrence time is.

Recently, a driving method for estimating a phase current of a motor has been made practicable, wherein a current flows through the shunt resistance 33 is directly, or through filtering and amplifying, inputted into an A/D converter, then being performed sampling, and inputted into a microcomputer or a motor phase current estimation circuit. In this case, when sampling of a shunt current is performed at the time the resonance occurs, the current sampling is performed with a current not actually flowing through the motor being added, and correct control cannot be performed. Meanwhile, when a sampling is tried avoiding the resonance time but if a switching time is shorter than the resonance time, it is theoretically impossible to perform current sampling. Therefore, when a switching time is short, the motor current cannot be observed and cannot be controlled. The length of the resonance time is extremely important factor for control. In the present embodiments 1 to 7, it is possible to make the wiring inductance one-tenth that in a conventional case wherein wiring is performed on one sheet of a printed circuit board, so that the occurrence time of resonance can be reduced by one order. Therefore, when sampling a current in the shunt resistance 33 and controlling the brushless direct-current motor 14, it is possible to shorten an undetectable time dramatically and reduce the limitation of current detection remarkably due to the shortened undetectable time. Further, resonance energy is theoretically the product of line inductance and a square of a current, so that the energy of developmental noise due to the resonance is reduced to one-tenth.

Further, in the embodiments 1 to 7, as described above, it is possible to configure in such a manner that the electrolytic capacitor 9 is arranged about 50 mm adjacent to the power devices. In the conventional printed circuit board, the electrolytic capacitor 9 is arranged far from the heat-generating components and the radiating fin 35, so jumper wires are used, whereof line length becomes about 500 mm in some cases. By shortening the line length of them, it is possible to reduce the line inductance of the inductance 50a and the inductance 50c to one-tenth, and to reduce energy of developmental noise due occurred by the resonance of the line inductance and the capacitor to one-tenth. Further, by arranging adjacently, there is no need to use unnecessary wirings and lead wires on the printed circuit board, and material efficiency is preferable.

As shown above, by wiring a small number of wirings around the power devices on the control board (the single-sided printed circuit board 31) and the other substrate (the lead frame molded board 100), it is possible to improve the material efficiency remarkably, and further to enhance detection accuracy of a motor current necessary for driving and reduce developmental noise as well.

Embodiment 9

Figure 16:
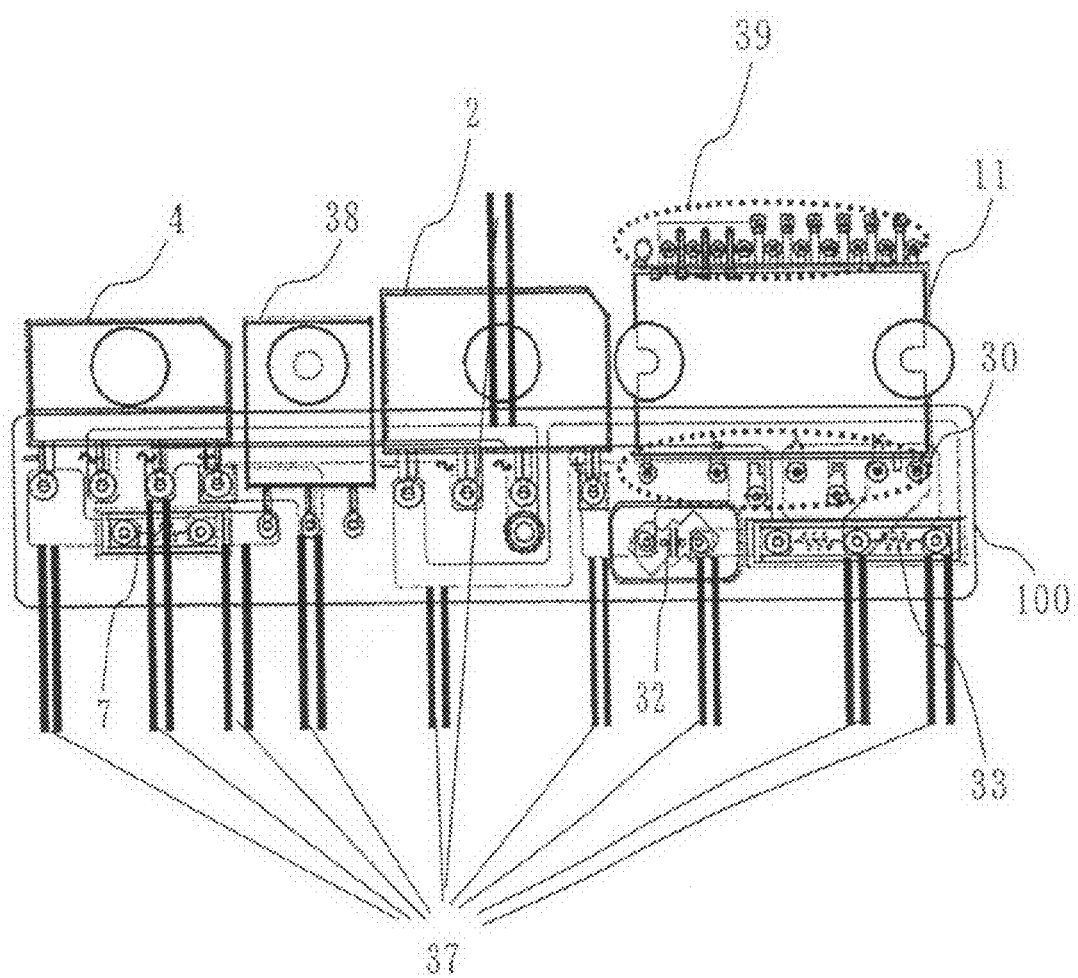
FIG. 16 A diagram describing the ninth embodiment, and is a plan view of the arrangement of the lead frame molded board 100 before bending the metal plate leads 37, and the mounting components.

FIG. 16 and FIG. 17 are diagrams describing the ninth embodiment. FIG. 16 is a plan view of arrangement of the lead frame molded board 100 before bending the metal plate leads 37, and the mounting components. FIG. 17 is a plan view of the lead frame molded board 100 after bending the leads, and the single-sided printed circuit board 31.

With reference to FIG. 16, it is further explained arrangement of the lead frame molded board 100 before bending the metal plate leads 37 and the mounting components.

In FIG. 16, the metal plate leads 37 consisting of plated copper or brass are molded with the mold resin 36 to form the lead frame molded board 100. The power module 11, the snubber capacitor 32, the shunt resistance 33, the diode bridge 2, the diode bridge 38, the power switching element 4 and the shunt resistance 7, except the alternating-current reactor 3 and the electrolytic capacitor 9, among the electronic components of the power circuit are mounted on the metal plate leads 37.

Some of the power terminals 30 (shown enclosed with a dotted line in FIG. 16) of the power module 11 are connected to the metal plate leads 37, meanwhile, the other power terminals 30 and the control wiring terminals 39 (shown enclosed with a dotted line in FIG. 16) are connected to the single-sided printed circuit board 31.

Further, the power switching element 4 also includes the power terminal and the control wiring terminal, wherein the power terminal is connected to the metal plate leads 37, and the control wiring terminal is connected to the single-sided printed circuit board 31.

Two metal plate leads 37 are provided for each pattern of a same electric potential. The metal plate leads 37 are produced by punching out with a die from the same sheet metal as the wiring pattern. Further, it is possible to produce by electric discharging or by cutting out with an automatic machine, such as a laser beam machine. Moreover, it is possible to produce by etching, etc. When producing metal leads by these methods, the metal leads are produced from the same base material by removing unnecessary parts, so that the used amount of the base material does not change depending on the number or the forms of the metal leads.

As shown in FIG. 17, on the single-sided printed circuit board 31, the power module 11, the snubber capacitor 32, the shunt resistance 33, the diode bridge 2, the diode bridge 38, the power switching element 4 and the shunt resistance 7, except the alternating-current reactor 3 and the electrolytic capacitor 9, among the electronic components of the power circuit are mounted, and further, the lead frame molded board 100 wherein the metal plate leads 37 are bent, and the electrolytic capacitor 9 are mounted.

The lead frame molded board 100, as shown in FIG. 17, small in size which is less than or equal to a half size of the single-sided printed circuit board 31, is arranged parallel to the single-sided printed circuit board 31, and at near the end of the long axis of the single-sided printed circuit board 31 in relation to the center of the printed circuit board 31. Further, the long axis of the lead frame molded board 100 is arranged in a shorter direction of the single-sided printed circuit board 31 as shown in FIG. 17.

A plurality of the metal plate leads 37 are bent to penetrate the single-sided printed circuit board 31 from the component side 31b to the solder side 31a. Further, the electrolytic capacitor 9 is arranged at a position near the penetrating metal plate leads 37. This intends to keep the power wiring on the single-sided printed circuit board 31 as short as possible. Since the electrolytic capacitor 9 is large in height, the electrolytic capacitor 9 is arranged at an opposite side of the power switching element 4, etc. to shorten the power wiring on the single-sided printed circuit board 31, and at the same time is arranged at the other side of the radiating fin 35 (not shown in FIG. 17) placed on the power devices, in relation to the lead frame molded board 100, to increase volumetric efficiency. Further, the life of the electrolytic capacitor 9 is highly temperature dependent. To extend the life at a same temperature of the electrolytic capacitor 9 as an expensive component is not cost-effective. For this reason, by arranging the electrolytic capacitor 9 according to the present embodiment, the electrolytic capacitor 9 is kept apart from the heat-generating components to extend its life. Further, by mounting the shunt resistance 7 and the shunt resistance 33 for current detection on the lead frame molded board 100, it is possible to significantly reduce dimension and capacity of the electrical component case 94 carrying the single-sided printed circuit board 31 whereon the other components are mounted, and the present circuit. In addition, it is possible to lower noise by reducing inductance in the power wiring. Furthermore, it is possible to improve reliability of the circuits and the devices against a solder crack, etc.

Further, it is possible to establish a bulkhead (not shown) between the radiating fin 35 and the electrolytic capacitor 9 only by changing a shape of a die at the time of producing the lead frame molded board 100 by die molding without using additional components, and to easily decrease the ambient temperature of the electrolytic capacitor 9 by insulating heat with the bulkhead. By decreasing the ambient temperature of the electrolytic capacitor 9, it is possible to extend the life of the electrolytic capacitor 9, which is a bottleneck for life of an inverter circuit due to drying up of electrolytic solution, etc. by the ambient temperature, and to extend the life of the drive circuit 300 for the compressor motor and an air conditioner carrying the same.

Since it is possible to pluralize the number of the terminals between the lead frame molded board 100 and the single-sided printed circuit board 31 without changing used volume of the base material, it is possible to reduce load applied to each terminal due to the weight of the power elements including the radiating fin 35 as a heavy component without changing the used amount of the based material. This makes it possible to reduce the stress applied to solders between the single-sided printed circuit board 31 and the metal plate leads 37, and to ensure reliability of the soldering parts for long periods. Further, as for a single-sided board, it is originally necessary to establish metallic eyelets to a board in advance by caulking to increase solder strength of the loaded part. However, by pluralizing the terminals, the load is dispersed and the stress in each terminal is reduced, so that metallic eyelets and placement thereof become unnecessary, and it is possible to improve economical efficiency. In a case of using a printed circuit board with multiple surfaces for the lead frame molded board 100, although the base material is increased, it is also obvious that there is an effect that metallic eyelets and placement thereof become unnecessary by pluralizing the terminals similarly.

It is possible to obtain a highly-reliable outdoor unit 200 for an air conditioner when mounting a motor drive circuit whereto any of the embodiments 3 to 9 is applied on the outdoor unit 200 for the air conditioner.

EXPLANATION OF REFERENCES

1 Alternating-current source, 2 Diode bridge, 3 Alternating-current reactor, 4 Power switching element, 7 Shunt resistance, 9 Electrolytic capacitor, 11 Power module, 11a Switching element, 11b Diode, 14 Brushless direct-current motor, 16 CPU, 30 Power terminal, 31 Single-sided printed circuit board, 31a Solder side, 31b Component side, 32 Snubber capacitor, 33 Shunt resistance, 34 Resin spacer, 35 Radiating fin, 37 Metal plate lead, 38 Diode bridge, 39 Control wiring terminal, 50a Inductance, 50b Inductance, 50c Inductance, 50d Inductance, 50d Inductance, 50e Inductance, 60 Alternating-current power wiring on an opposite side of alternating-current reactor 3, 80 Terminal, 81 Actuator drive circuit, 82 Noise filter, 83 Control power source, 84 Fan inverter, 85 Communication circuit, 86 Compressor, 87 Heat exchanger, 90 Electrical component case, 92 Propeller fan, 92a Fan motor, 94 Electrical component case, 100 Lead frame molded board, 101 Projection, 101a Projection, 101b Projection, 101c Projection, 101d Projection, 102 Projection, 102a Projection, 102b Projection, 103 Solder, 131 Double-sided printed circuit board, 200 Outdoor unit for air conditioner, 200a Machine chamber, 200b Blower chamber, 300 Drive circuit for compressor motor, 300a Inverter circuit, 300b Converter circuit.

The invention claimed is:

1. A motor drive circuit for driving the motor using a converter circuit and an inverter circuit, the motor drive circuit comprising:

a lead frame molded board whereon an electronic component making up the converter circuit and the inverter circuit is mounted, and whereon a metal plate lead is molded with a mold resin; and a printed circuit board for a control circuit, wherein a power terminal of the electronic component is connected to the lead frame molded board, and a control wiring terminal of the electronic component is connected to the printed circuit board.

2. The motor drive circuit according to claim 1, wherein the converter circuit includes an electrolytic capacitor, the electrolytic capacitor being mounted on the printed circuit board.

3. The motor drive circuit according to claim 1, wherein the inverter circuit includes a shunt resistance for detecting a current, the shunt resistance being mounted on the lead frame molded board.

4. The motor drive circuit according to claim 1, wherein the lead frame molded board includes a projection as a spacer formed together with the mold resin.

5. The motor drive circuit according to claim 4, wherein the electronic component includes a radiating fin for cooling, and wherein the projection, which is formed in a longer direction of a component surface of the lead frame molded board whereon the electronic component is mounted, adjusts a height of the electronic component whereto the radiating fin is fixed.

6. The motor drive circuit according to claim 4, wherein the projection is formed between the printed circuit board and the lead frame molded board in a shorter direction of the lead frame molded board as a spacer.

7. The motor drive circuit according to claim 6, wherein another projection is additionally provided over the projection, the another projection being engaged with a hole formed in the printed circuit board.

8. The motor drive circuit according to claim 1, wherein the lead frame molded board includes the metal plate lead, by which the lead frame molded board is connected with the printed circuit board.

9. The motor drive circuit according to claim 8, wherein the metal plate lead is bent to connect the lead frame molded board with the printed circuit board.

10. The motor drive circuit according to claim 1, wherein a connection of the power terminal with the lead frame molded board and a connection of the control wiring terminal with the printed circuit board are made by soldering.

11. The motor drive circuit according to claim 1, wherein the printed circuit board is made up of a single-sided printed circuit board.

12. The motor drive circuit according to claim 11, wherein the single-sided printed circuit board is made up of a paper base material.

13. The motor drive circuit according to claim 1, wherein the printed circuit board is made up of a double-sided printed circuit board.

14. An outdoor unit for an air conditioner comprising a compressor for compressing a refrigerant in a machine chamber, wherein an electrical component case carrying the motor drive circuit of claim 13 is fixed to an upper surface of the compressor.

15. The outdoor unit for the air conditioner according to claim 14, wherein the motor drive circuit includes an acceleration sensor.

16. The motor drive circuit according to claim 1,
wherein the electronic component includes a diode bridge, the diode bridge being arranged at an end of a long axis of the lead frame molded board.

17. The motor drive circuit according to claim 16 comprising an alternating-current power wiring on an opposite side of an alternating-current reactor, the alternating-current power wiring being connected to an alternating-current source, wherein the alternating-current power wiring on the opposite side of the alternating-current reactor is formed adjacent to the end of the long axis of the lead frame molded board whereon the diode bridge is arranged, and near an end of the printed circuit board.

18. The motor drive circuit according to claim 1,
wherein the lead frame molded board is mounted at a right angle with the printed circuit board.

19. The motor drive circuit according to claim 1,
wherein a power device of the electronic component is mounted at a right angle with the printed circuit board.

20. The motor drive circuit according to claim 19,
wherein the power device includes a power module, of which a control wiring terminal and a power terminal are linearly arranged.

21. A motor drive circuit for driving a motor using a converter circuit and an inverter circuit, the motor drive circuit comprising:
a multi-layer printed circuit board whereon an electronic component making up the converter circuit and the inverter circuit is mounted; and
a printed circuit board for a control circuit,
wherein a power terminal of the electronic component is connected to the multi-layer printed circuit board, and a control wiring terminal of the electronic component is connected to the printed circuit board for the control circuit.

22. The motor drive circuit according to claim 1,
wherein a connector for connecting with the motor is formed on the lead frame molded board at a same time as producing the lead frame molded board.

23. The motor drive circuit according to claim 1,
wherein the lead frame molded board is less than or equal to a half size of the printed circuit board.

24. The motor drive circuit according to claim 3,
wherein a current flowing in the shunt resistance is sampled to drive the motor.

25. The motor drive circuit according to claim 1
wherein the converter circuit includes an electrolytic capacitor, the electrolytic capacitor being mounted adjacent to the lead frame molded board whereon the electronic component making up the converter circuit and the inverter circuit is mounted.

26. An outdoor unit for an air conditioner, which is equipped with the motor drive circuit of claim 1.

27. The motor drive circuit according to claim 21, wherein the converter circuit includes an electrolytic capacitor, the electrolytic capacitor being mounted adjacent to the multi-layer printed circuit board whereon the electronic component making up the converter circuit and the inverter circuit is mounted.

28. An outdoor unit for an air conditioner, which is equipped with the motor drive circuit of claim 21.

29. The motor drive circuit according to claim 1,
wherein the control wiring terminal of the electronic component is connected to the printed circuit board independent of the lead frame molded board so as to be electrically isolated from the lead frame molded board.

30. The motor drive circuit according to claim 21,
wherein the control wiring terminal of the electronic component is connected to the printed circuit board independent of the multi-layer printed circuit board so as to be electrically isolated from the multi-layer printed circuit board.

\* \* \* \* \*